United States Patent
Smith et al.

[19]

[11] Patent Number: 6,166,541
[45] Date of Patent: Dec. 26, 2000

[54] APPARATUS FOR AND METHOD OF NUCLEAR QUADRUPOLE RESONANCE TESTING OF A SAMPLE

[75] Inventors: John Alec Sydney Smith, London; Simon Peter Beevor, Swanley; Michael David Rowe, London, all of United Kingdom

[73] Assignee: British Technology Group Limited, London, United Kingdom

[21] Appl. No.: 09/005,026

[22] Filed: Jan. 12, 1998

Related U.S. Application Data

[63] Continuation of application No. PCT/GB96/01676, Jul. 11, 1996.

[30] Foreign Application Priority Data

Jul. 11, 1995 [GB] United Kingdom ............... 9514142

[51] Int. Cl.$^7$ ........................................... G01V 3/00
[52] U.S. Cl. .......................................... 324/300; 324/309
[58] Field of Search ......................... 324/300, 307, 324/309, 310, 313

[56] References Cited

U.S. PATENT DOCUMENTS

| | | | |
|---|---|---|---|
| 5,814,987 | 9/1998 | Smith et al. | 324/300 |
| 5,814,989 | 9/1998 | Smith et al. | 324/300 |

FOREIGN PATENT DOCUMENTS

| | | |
|---|---|---|
| 426 851 A1 | 5/1991 | European Pat. Off. . |
| 2 257 525 | 1/1993 | United Kingdom . |
| 92/17793 | 10/1992 | WIPO . |
| 92/17794 | 10/1992 | WIPO . |
| 92/21987 | 12/1992 | WIPO . |
| 92/21989 | 12/1992 | WIPO . |
| 95/09368 | 4/1995 | WIPO . |
| 95/16926 | 6/1995 | WIPO . |

OTHER PUBLICATIONS

Gonano, "Nuclear Magnetic Resonance and Nuclear Quadrupole Resonance for Bomb Detection", Electro Conference Record, 4, Apr. 1979, pp. 1–5.

Ageev, et al., "Composite pulses in nuclear quadrupole resonance", Molecular Physics 1994, vol. 83, No. 2, pp. 193–210.

Tannus, et al., "Improved Performance of Frequency–Swept Pulses Using Offset–Independent Adiabaticity", Journal of Magnetic Resonance, Series A 120, 1996, pp. 133–137.

Grechishkin, "NQR Device for Detecting Plastic Explosives, Mines, and Drugs", Applied Physics A 55, 1992, pp. 505–507.

(List continued on next page.)

*Primary Examiner*—Hezron Williams
*Assistant Examiner*—Brij B. Shrivastav
*Attorney, Agent, or Firm*—Pillsbury Madison & Sutro LLP

[57] ABSTRACT

Apparatus for Nuclear Quadrupole Resonance testing a remote sample containing a given species of quadrupolar nucleus includes at least one probe (112) having a given maximum cross-sectional dimension; a device (102) for applying excitation to the probe or at least one of the probes to excite nuclear quadruple resonance for a selected range of distance of the sample from each such probe, the selected range being at least one tenth of the given maximum dimension of the probe, the apparatus being adapted to produce a non-uniform field over the selected range; and a device (106) for detecting the resonance response signal from the sample via the probe or at least one of the probes; the excitation being such as would generate non-zero resonance signals at all distances within the selected range.

56 Claims, 11 Drawing Sheets

OTHER PUBLICATIONS

Grechishkin, et al., "Adiabatic Demagnetization and Two–Frequency Methods in $^{14}$N Quadrupole Resonance Spectroscopy", Advances in Nuclear Quadrupole Resonance, vol. 5, 1983, pp. 1–13.

Buess, et al., "NQR Detection Using a Meanderline Surface Coil", Journal of Magnetic Resonance 92, 1991, pp. 348–362.

Hischfeld, et al., "Short Range Remote NQR Measurements", Journal of Molecular Structure, 58, 1980, pp. 63–77.

Garwood, et al., "$B_1$ Insensitive Adiabatic RF Pulses", NMR Basic Principles and Progress, vol. 26, 1992, pp. 109–147.

Vega, "Theory of $T_1$ relaxation measurements in pure nuclear quadrupole resonance for spins $I=1$", The Journal of Chemical Physics, vol. 61, No. 3; Aug. 1, 1974, pp. 1093–1100.

Bosch, et al., "Surface Coli Spectroscopy", NMR Basic Principles and Progress, vol. 27, 1992, pp. 4–44.

Rommel, et al., "Spectroscopic rotating–frame NQR imaging (pNQRI) using surface cells", Measurement Science & Technology 2, No. 9, Sep. 1991, pp. 866–871.

Jach, T. "Detection of nuclear quadrupole resonance via induced longitudinal magnetization", Applied Physics Letters, vol. 28, No. 1, Jan. 1, 1976, pp. 49–51.

APPARATUS FOR AND METHOD OF NUCLEAR QUADRUPOLE RESONANCE TESTING OF A SAMPLE This is a Continuation of International Appln. No. PCT/GB96/01676 filed Jul. 11, 1996 which designated the U.S.

The present invention relates to apparatus for and a method of Nuclear Quadrupole Resonance testing a sample containing a given species of quadrupolar nucleus, and to apparatus for and a method of determining a measure of the distance of a sample from a probe, the sample containing a given species of quadrupolar nucleus.

The invention preferably relates to the testing of what are hereinafter termed "remote" samples. Although the following definition is not exclusive, remote samples are typically samples which lie outside the plane of the excitation/detection probe, often at a distance away from the probe which may be comparable with or greater than the largest cross-sectional dimension of the probe. With remote testing, it is often only possible to access the sample from one side, for instance if the sample is buried or concealed. Testing of remote samples which can only be accessed from one side is often termed "one-sided" testing; in such tests only the field from one side of the probe is utilised, the probe usually being shielded on the other side.

More particularly, the invention relates to the detection of the presence of remote samples containing quadrupolar nuclei.

As an example, the present invention has particular application to the detection of $^{14}$N quadrupole signals in drugs, such as cocaine and heroin, concealed on or within the person, possibly using a hand-held probe. Again, in industrial processes, it can be used to detect signals from quadrupole-containing materials. Such materials might be proteins in foodstuffs, or quadrupole containing substances on conveyor belts, inside furnaces or nuclear reactors or in chemically or physically hazardous surroundings in which the probe must be located away from the remainder of the testing apparatus, possibly even on one side only of the system. The probe may be located inside the pressure vessel of the nuclear reactor, which may be at extremes of temperature and pressure.

As another example, the invention has particular application to the detection of $^{14}$N quadrupole resonance signals from explosives such as TNT, RDX, HMX, PETN and compositions of such materials, for instance Semtex, contained within objects placed on the ground surface or buried underground, or to the detection of such explosives concealed beneath or behind concealing barriers, or on the person.

In the case of explosives, if provided in relatively small quantities (perhaps 10 g to 100 g or 1 kg) they may for example be (a) scattered on the ground surface or (b) hand laid beneath the surface at a depth of a few centimeters (say 2 to 6 cm). If provided in larger quantities perhaps 1 kg to 10 kg or 20 kg—case (c)), they are usually laid at a depth of about 1 to 20 or 25 cm. The probe would usually be at a distance of around 5 to 20 cm from the ground, and the explosive would usually be between 1 and 5 cm thick. If, say the distance from the probe to the ground were a typical 10 cm and the thickness of the explosive were about 3 cm, then the depth that the probe would need to examine would be roughly 8.5 cm for case (a), 13 cm for case (b) and 10 to 35 cm for case (c).

Other possible uses of the invention are in exploration, for example, in mining, down boreholes (for instance for petrochemical exploration), or in structural engineering, for example, in the detection of faults in concrete or cement structures.

Amongst the most noteworthy of the quadrupolar nuclei are $^{11}$B, $^{14}$N, $^{23}$Na, $^{25}$Mg, $^{27}$Al, $^{39}$K, $^{51}$V, $^{55}$Mn, $^{59}$Co, $^{63}$Cu, $^{75}$As, $^{121}$Sb and $^{209}$Bi. The sample would usually be in polycrystalline or powdered rather than single crystal form.

As opposed to Nuclear Magnetic Resonance (NMR) techniques, Nuclear Quadrupole Resonance (NQR) techniques have the advantage that they do not require the sample to be placed in a strong static magnetic field; usually they function in the absence of any applied magnetic field. Interference from metallic or ferromagnetic objects can be eliminated.

In another related application, the invention may be used to provide an estimate of the quantity of sensitive material inside the sample under examination and its distance from the probe, providing additional applications in medicine as an adjunct to magnetic resonance imaging.

A method of detecting the presence of a given species of quadrupolar nucleus in a sample is known from International Patent Application No. PCT/GB94/02070 (British Technology Group Ltd.) whose disclosure is incorporated herein by reference, and which claims priority from unpublished United Kingdom Patent Application No. 9319875.2. The sample is subjected to r.f. excitation pulses of a given shape and the NQR response is observed as a free induction decay (f.i.d.) immediately following such a pulse (or pulses) and/or as echoes produced by application of two or more such pulses. The pulses are preferably shaped so as to be substantially rectangular in the frequency domain, and are subject to a phase variation which has a non-linear, preferably quadratic, variation with time over the duration of the pulse.

The aforementioned patent application, together with International Patent Application No. PCT/GB92/00580 (also to British Technology Group Ltd.), describes how the excitation pulses may be manipulated so as to reduce the deleterious effects of temperature or pressure variations experienced by the sample on the performance and sensitivity of the NQR tests.

International Patent Application No. PCT/GB92/01004 (also to British Technology Group Ltd.) describes how a quadrupole resonance image may be obtained from samples contained within opposed coil arrays. As stated above, the present invention is mainly concerned with cases in which access to the sample is from one side only, such as is a characteristic of buried explosives.

International Patent Application No. PCT/US92/03116 and a closely related paper ("NQR Detection Using a Meanderline Surface Coil", by Buess, M. L. et al., J. Mag. Res., 92, 1991, 348–362) describe a meanderline surface coil which is deliberately designed to detect explosives and narcotics only to a very limited depth, typically 1 or 2 cm, a very small fraction of the overall dimension of the probe coil. The limited depth to which the meanderline coil is effective is completely inadequate for many purposes of practical interest.

A paper by Hirschfeld et al. entitled "Short Range Remote NQR Measurements" (J. Mol. Struct., 58, 1980, 63–77) discloses the detection of buried explosives using NQR techniques. Separate experiments are described, one in which explosive is detected at a depth of 6 cm, and one in which the depth is 10 cm. In each case the testing apparatus is optimised for the particular depth of interest. There is no suggestion of any technique for the detection of explosive at any other depth or even of the desirability of detection at other depths.

It has now been realised pursuant to the present invention that in the testing of remote samples it is desirable to carry out tests over a substantial selected range of distance away from the excitation/detection probe or probes, rather than at just one or two fixed distances. As used herein in this context, the term "substantial" is defined in terms of the range being, say, at least one tenth of the maximum cross-sectional dimension of the excitation/detection probe. Of course, other proportions would also be possible, such as one 1/20 of the maximum dimension, or 1/5, 1/3 or 1/2. The selected range may even be the same size or larger than the maximum dimension. In putting the present invention into practice, the present inventors used as the probe a plane spiral coil of outside diameter (maximum cross-sectional dimension) roughly 25 cm. The selected range was between roughly 5 and 25 cm from the coil.

It has furthermore been discovered that conventional excitation techniques such as that taught by Hirschfeld et al. would not operate satisfactorily over the substantial ranges referred to above. As explained in detail later, it has been discovered that, surprisingly, over any substantial range conventional techniques would be expected to give rise to a lack of uniformity of sensitivity of detection to the extent that samples at certain depths might not be detected at all.

The present invention in various preferred aspects seeks not only to provide good sensitivity over a substantial distance range but also with the selected range starting at a substantial distance (remoteness) from the probe or probes. In this context "substantial" connotes, say, at least 1/20, 1/10, 1/5, 1/3 or 1/2 of, or even preferably greater than, the maximum dimension of the probe. This is to take into account that in many situations of practical interest the probe or probes may be a substantial distance away from the sample.

According to the present invention, there is provided apparatus for Nuclear Quadrupole Resonance testing a remote sample containing a given species of quadrupolar nucleus, comprising:

at least one probe having a given maximum cross-sectional dimension;

means for applying excitation to the probe or at least one of the probes to excite (detectible) nuclear quadrupole resonance for a selected range of distance of the sample from the or one such probe, the selected range being at least one tenth of the given maximum dimension of the probe or said one such probe, the apparatus being adapted to produce a non-uniform field over the selected range; and means for detecting the resonance response signal from the sample via the probe or at least one of the probes;

the excitation being such as would generate non-zero resonance response signals at all distances within the selected range.

The restriction that the apparatus is adapted to produce a non-uniform field over the selected range is preferably intended to be interpreted to exclude configurations where the sample is accessed from both sides (for example, coils in Helmholtz pairs) using coils which are paired to produce highly uniform $B_1$ fields. Hence "non-uniform" may imply a variation of greater than, say, 3, 5 or 10% in field over the selected range.

By arranging the excitation applying means to generate non-zero resonance response signals at all distances within the selected range, the present invention can provide significantly more uniform sensitivity in the testing of remote objects over the selected range than would have been possible if conventional techniques had been employed in the testing of remote samples.

As an indication of the acceptable variation in sensitivity over the selected range, preferably the excitation is such that, for a given sample, over the selected range of sample distance the minimum resonance response signal detected would be no less than one twentieth, preferably no less than 1/10, 1/5, 1/4, 1/3 or 1/2, of the maximum resonance response signal.

Preferably the excitation is such as to generate a flip angle which is substantially constant over the selected range, so that the response signals would be as uniform as possible over the selected range. As taught herein, this can be achieved in a number of ways, including by the use of excitation in the form of appropriately shaped pulses.

The term "substantially constant" is to be interpreted in the light of the general level of inaccuracy inherent in NQR testing. For instance, the lowest flip angle may suitably be greater than 50%, 75% or 90% of the highest flip angle.

Preferably also, the excitation is such as to generate a flip angle of at least $90°_{effective}$ at at least one location, preferably at at least two separate locations, in the selected range. As explained in detail later in relation to the three preferred aspects of the present invention, this feature can afford an effective way of putting the invention into practice.

The probe or at least one of the probes may be in the form of a spiral coil, since this can transmit and receive excitation at a substantial distance from the probe or probes and over a substantial range of distance.

In a first preferred aspect of the invention, the excitation is such as to generate a flip angle of greater than $90°_{effective}$ but less than $180°_{effective}$ at that extreme of the selected sample distance range nearer the or said one such probe. By this feature, as explained in detail later, a particular region of the flip angle versus distance curve can be utilised where flip angle actually increases with distance away from the or said one such probe. This can give rise to an NQR testing technique for which the sensitivity is considerably more uniform over the selected range than would have been possible if conventional techniques had been employed.

Preferably, the excitation is such that that extreme of the selected sample distance range nearer the or said one such probe is nearer the location for which flip angle is $180°_{effective}$ than that for which flip angle is $90°_{effective}$. This can ensure that the beneficial region of the flip angle versus distance curve is well utilised. It will be understood that a flip angle of $90°_{effective}$ is one which produces a maximum free induction decay at the receiver coil/probe; a flip angle of $180°_{effective}$ is one which produces a zero free induction decay at the receiver coil/probe. For an I=1 spin system, these values correspond to $119°_{(actual)}$ and $257°_{(actual)}$ respectively.

For the same reason, preferably the excitation is such that that extreme of the selected sample distance range farther from the or said one such probe is farther than the location for which, between a flip angle of 0 and $180°_{effective}$, the excitation would generate the most intense resonance response signal in the sample.

Again, for the same reason, preferably the excitation is such that that flip angle at that extreme of the selected sample distance range farther from the or said one such probe is less than $90°_{effective}$, preferably less than 75, 60 or even $30°_{effective}$.

In a second preferred aspect of the invention, preferably the excitation applying means is such as to apply, preferably at the same excitation frequency, at least a first and second kind of excitation, the first kind of excitation being arranged to generate a flip angle which differs at each and every location within the selected range from that generated by the second kind of excitation at that particular location.

This is a particularly advantageous way of achieving a sensitivity of testing which is considerably more uniform over the selected range than would have been possible if conventional techniques had been employed, in that the two (or more) kinds of excitation can be individually optimised for two or more sub-ranges within the selected range.

Preferably, for the first kind of excitation the sign of the resonance response signal would change over the selected range of sample distance whereas for the second kind the response signal would have no zero crossings over the selected range. This has been found to afford a particularly advantageous combination of the two kinds of excitation, especially when, as is preferred, the location within the selected range for which the second kind of excitation generates a $90°_{effective}$ flip angle is a location at which the second kind of excitation would generate a resonance response signal of opposing sign to the sign of the response signal which would be generated by the first kind of excitation at that location.

Preferably, the plurality of kinds of excitation are interleaved with one another to form a repeating cycle of excitation, each of the kinds of excitation being applied during each such repeating cycle. In this manner the overall duration of the test need not be increased substantially by comparison with the case where only one kind of excitation were applied.

If the plurality of kinds of excitation are interleaved, preferably in each such repeating cycle the excitation generating the lower or lowest flip angle precedes the excitation generating the higher or highest flip angle. This has been found to be a feature which is particularly important for ensuring a sufficient uniformity of sensitivity.

Again for uniformity of sensitivity, preferably the detection means is adapted to acquire and process the resonance signals generated in response to the respective kinds of excitation separately.

The apparatus of the present invention may be for determining a measure of the distance of the sample from the or said one such probe, in which case it preferably includes means for comparing the resonance signals generated in response to the respective kinds of excitation and determining from the comparison a measure of the distance of the sample from the or said one such probe.

By this feature is provided a relatively simple but effective technique for determining the distance of a given remote sample. Such information could be particularly useful if the sample is in some way concealed.

This important feature is also provided independently. Hence, according to a further aspect of the present invention there is provided apparatus for determining a measure of the distance of a sample from a probe, the sample containing a given species of quadrupolar nucleus, comprising:

at least one probe;

means for applying excitation to the probe or at least one of the probes to excite nuclear quadrupole resonance for a selected range of distance of the sample from the or one such probe, the excitation applying means being such as to apply at least a first and second kind of excitation, the first kind of excitation being arranged to generate a flip angle which differs at each and every location within the selected range from that generated by the second kind of excitation at that particular location;

means for detecting the resonance response signals from the sample via the probe or at least one of the probes; and means for comparing the resonance signals generated in response to the respective kinds of excitation and determining from the comparison a measure of the distance of the sample from the or said one such probe.

Preferably, the comparing and determining means is adapted additionally to determine from the comparison a measure of the quantity of the given species of quadrupolar nucleus. Preferably again, the excitation applying means is adapted to apply at least two different pairs of first and second kinds of excitation, since use of at least two different pairs of excitation can improve the sensitivity of the tests, especially where more than one sample is present in the selected range.

A third preferred aspect of the invention is flow introduced.

Adiabatically applied excitation is known in the separate field of Nuclear Magnetic Resonance imaging to have the ability to produce a constant flip angle over a given region, as described for example by M. Garwood and K. Ugurbil, NMR Basic Principles and Progress, Vol. 26, Springer-Verlag, 1992, pp. 109–147.

However, adiabatically applied excitation would not have been expected to function in Nuclear Quadrupole Resonance, and especially would not have been expected to be able to produce a constant flip angle over a given region. In NQR, where the initial macroscopic magnetisations of the constituent crystals/crystallites are distributed in all directions (so that each experiences a different flip angle), it would have been supposed that such an omni-directional distribution would have prevented the proper functioning of adiabatic pulses.

It has now been discovered pursuant to the present invention that, surprisingly, adiabatically applied excitation can actually function satisfactorily in the field of NQR.

Therefore, according to the third preferred aspect of the present invention, the excitation applying means is adapted to apply the excitation adiabatically, and to generate a substantially constant flip angle over the selected range. This can ensure a particularly uniform sensitivity of test over the selected range.

This important feature of the invention is provided independently. Hence, according to the third preferred aspect of the present invention, there is provided apparatus for Nuclear Quadrupole Resonance testing a sample containing a given species of quadrupolar nucleus, comprising:

means for applying excitation to the sample adiabatically to excite nuclear quadrupole resonance; and means for detecting the resonance response signal from the sample;

the excitation being such as to generate a substantially constant flip angle over a given region.

The given region may be defined in terms of a range of distances away from the probe of the NQR apparatus, as discussed above. The term "substantially constant" is meant to be interpreted in the context of the inaccuracies inherent in NQR testing, and may preferably connote a variation of less than 50%, preferably less than 20, 10 or 5% between the maximum value of flip angle and the minimum value.

In order to ensure the most sensitive tests, it may be preferable that the excitation is arranged to produce a substantially constant flip angle for a variation of the field of at least a factor of one to five, preferably one to ten, twenty or even thirty.

Preferably, the excitation is in the form of an adiabatic fast passage. Suitable excitation sequences involving an adiabatic fast passage are the Adiabatic Half Passage (AHP), the Adiabatic Full Passage (which involves two half-passages), and the variable-angle plane rotation pulse BIR-4, which includes a number of segments of AHP and AFP.

Preferably, the amplitude or frequency or phase of the excitation is arranged to be modulated according to hyperbolic tan or inverse tan functions. This has been found a particularly advantageous way of putting the invention into effect.

Preferably again, the excitation includes an adiabatic plane rotation pulse. An adiabatic plane rotation pulse would not have been expected to operate successfully in NQR, since it would have been believed to require the setting of particular values of flip angle in order to function successfully. This is not possible in NQR where the crystallites in a sample have random orientations.

An adiabatic plane rotation pulse, it has now been found, can in NQR enable the generation of echo resonance response signals, due to the fact that it can conserve phase between one pulse and the next. Indeed, the invention preferably provides that the excitation is arranged to generate echo response signals.

The present invention extends to a method of Nuclear Quadrupole Resonance testing a remote sample containing a given species of quadrupolar nucleus, comprising:

providing at least one probe having a given maximum cross-sectional dimension;

applying excitation to the probe or at least one of the probes to excite nuclear quadrupole resonance for a selected range of distance of the sample from the or one such probe, the selected range being at least one tenth of the given maximum dimension of the probe or said one such probe, a non-uniform field being produced over the selected range; and detecting the resonance response signal from the sample via the probe or at least one of the probes;

the excitation being such as would generate non-zero resonance response signals at all distances within the selected range.

The probe or the probes generally may be positioned (at any one time) on one side of the sample only.

Preferably, the excitation is such that, for a given sample, over the selected range of sample distance the minimum resonance response signal detected would be no less than one twentieth, preferably no less than 1/10, 1/5, 1/4, 1/3 or 1/2, of the maximum resonance response signal.

Preferably, the excitation is such as to generate a flip angle which is substantially constant over the selected range.

Preferably, the excitation is pulsed excitation repeated at a pulse repetition time τ, the sample has a spin-lattice relaxation time $T_1$, and the value of $\tau/T_1$ is less than 5, preferably less than 2, 1, 0.5, 0.1 or even 0.05. By this feature, it has been found that the sensitivity of detection can be more nearly uniform over the selected range.

Preferably, the excitation is such as to generate a flip angle of at least $90°_{effective}$ at at least one location, preferably at at least two separate locations, in the selected range.

In a first preferred aspect of the invention, the excitation is such as to generate a flip angle of greater than $90°_{effective}$ but less than $180°_{effective}$ at that extreme of the selected sample distance range nearer the or said one such probe.

This important feature is provided independently. Hence, according to the first preferred aspect of the present invention, there is provided a method of detecting the presence of a remote sample containing a given species of quadrupolar nucleus, comprising:

providing at least one probe;

applying excitation to the probe or at least one of the probes to excite nuclear quadrupole resonance for a selected range of distance of the sample from the or one such probe; and detecting the resonance response signal from the sample via the probe or at least one of the probes;

the excitation being such as to generate a flip angle of greater than $90°_{effective}$ but less than $180°_{effective}$ at that extreme of the selected sample distance range nearer the or said one such probe.

Preferably, the excitation is such that that extreme of the selected sample distance range nearer the or said one such probe is nearer the location for which flip angle is $180°_{effective}$ than that for which flip angle is $90°_{effective}$.

Preferably, the excitation is such that that extreme of the selected sample distance range farther from the or said one such probe is farther than the location for which, between a flip angle of 0 and $180°_{effective}$, the excitation would generate the most intense resonance response signal in the sample.

Preferably, the excitation is such that that flip angle at that extreme of the selected sample distance range farther from the or said one such probe is less than $90°_{effective}$, preferably less than 75, 60 or even $30°_{effective}$.

In a second preferred aspect of the invention, at least a first and second kind of excitation are applied, preferably at the same excitation frequency, the first kind of excitation being arranged to generate a flip angle which differs at each and every location within the selected range from that generated by the second kind of excitation at that particular location.

This important feature is provided independently. Hence, according to the second preferred aspect of the present invention, there is provided a method of Nuclear Quadrupole Resonance testing a remote sample containing a given species of quadrupolar nucleus, comprising:

providing at least one probe;

applying excitation to the probe or at least one of the probes to excite nuclear quadrupole resonance for a selected range of distance of the sample from the or one such probe; and detecting the resonance response signal from the sample via the probe or at least one of the probes;

applying excitation to the probe or at least one of the probes to excite nuclear quadrupole resonance for a selected range of distance of the sample from the or one such probe; and detecting the resonance response signal from the sample via the probe or at least one of the probes;

at least a first and second kind of excitation being applied, the first kind of excitation being arranged to generate a flip angle which differs at each and every location within the selected range from that generated by the second kind of excitation at that particular location.

Preferably, for the first kind of excitation the sign of the resonance response signal would change over the selected range of sample distance whereas for the second kind the response signal would have no zero crossings over the selected range.

Preferably, the location within the selected range for which the second kind of excitation generates a $90°_{effective}$ flip angle is a location at which the second kind of excitation would generate a resonance response signal of opposing sign to the sign of the response signal which would be generated by the first kind of excitation at that location.

Preferably the plurality of kinds of excitation are interleaved with one another to form a repeating cycle of excitation, each of the kinds of excitation being applied during each such repeating cycle.

Preferably, in each such repeating cycle the excitation generating the lower or lowest flip angle precedes the excitation generating the higher or highest flip angle.

Preferably, the resonance signals generated in response to the respective kinds of excitation are acquired and processed separately.

The method may be a method of determining a measure of the distance of the sample from the or said one such probe, in which case preferably the resonance signals generated in response to the respective kinds of excitation are compared and a measure of the distance of the sample from the or said one such probe is determined from the comparison.

This important feature is also provided independently. Hence, according to a further aspect of the present invention there is provided a method of determining a measure of the distance of a sample from a probe, the sample containing a given species of quadrupolar nucleus, comprising:

providing at least one probe;

applying excitation to the probe or at least one of the probes to excite nuclear quadrupole resonance for a selected range of distance of the sample from the or one such probe, at least a first and second kind of excitation being applied, the first kind of excitation generating a flip angle which differs at each and every location within the selected range from that generated by the second kind of excitation at that particular location;

detecting the resonance response signals from the sample via the probe or at least one of the probes; and comparing the resonance signals generated in response to the respective kinds of excitation and determining from the comparison a measure of the distance of the sample from the or said one such probe.

Preferably, additionally determined from the comparison is a measure of the quantity of the given species of quadrupolar nucleus.

Preferably, at least two different pairs of first and second kinds of excitation are applied.

In a third preferred aspect of the present invention, the excitation is applied adiabatically, and generates a substantially constant flip angle over the selected range.

This important feature of the invention is provided independently. Hence, according to the third preferred aspect of the present invention, there is provided a method of Nuclear Quadrupole Resonance testing a sample containing a given species of quadrupolar nucleus, comprising:

applying excitation to the sample adiabatically to excite nuclear quadrupole resonance; and detecting the resonance response signal from the sample;

the excitation generating a substantially constant flip angle over a given region.

Preferably, the excitation is arranged to generate a substantially constant flip angle for a variation of the field of at least a factor of one to five, preferably one to ten, twenty or thirty. The excitation may be in the form of an adiabatic fast passage. The amplitude or frequency or phase of the excitation may be modulated according to hyperbolic tan or inverse tan functions. The excitation may include an adiabatic plane rotation pulse. The excitation may generate echo response signals.

As a general example of the efficacy of the present invention, the example of detecting the presence of explosives (in this particular case, the explosive RDX) in a given area is considered. An acceptable signal-to-noise ratio (defined as signal r.m.s noise voltage) is commonly considered to be 5:1. Experiments conducted pursuant to the present invention show that a signal-to-noise ratio of 5:1 can be attained from a moderately sized sample of RDX at a realistic distance from a probe (some tens of centimeters) in a few seconds. Similar acquisition times would apply alike to smaller samples at lesser depths and larger samples at greater depths. Indeed, within limits, simultaneous detection of explosives over a range of depths could be achieved within a similar acquisition time. It has been estimated that the technique of the present invention could be employed to clear an area of explosives in an acceptably short time.

Preferred features of the present invention as well as examples of its operation and the theory underlying the invention will now be described, purely by way of example, with reference to the accompanying drawings, in which.

Figure 6A:
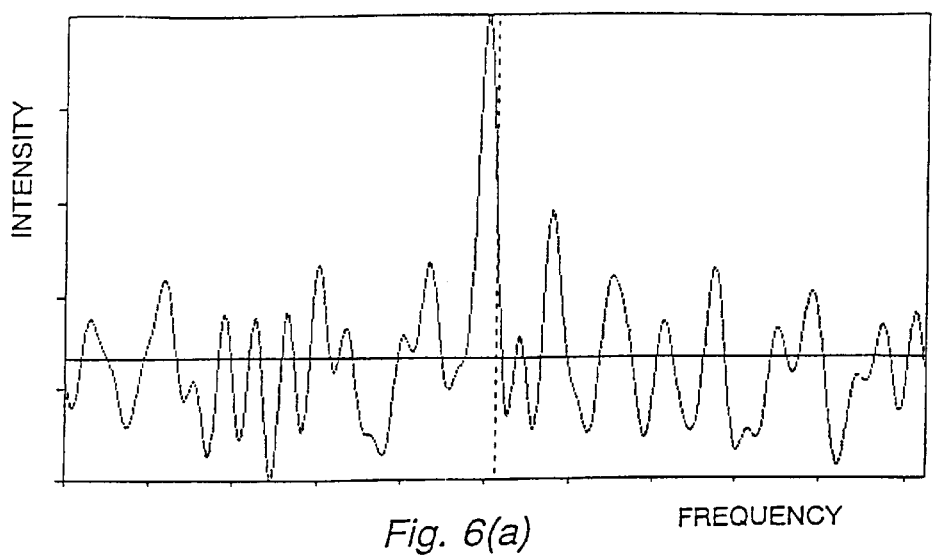
Figure 6B:
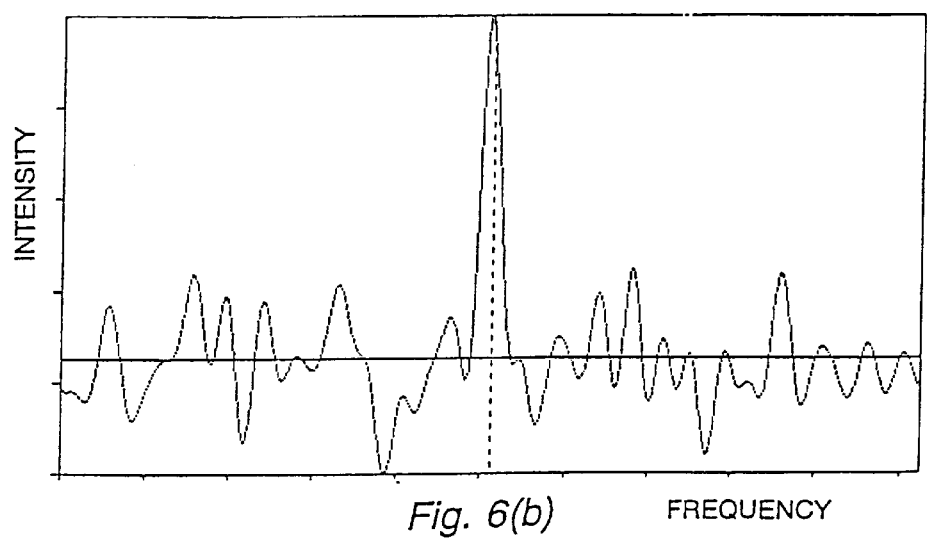
Figure 7:
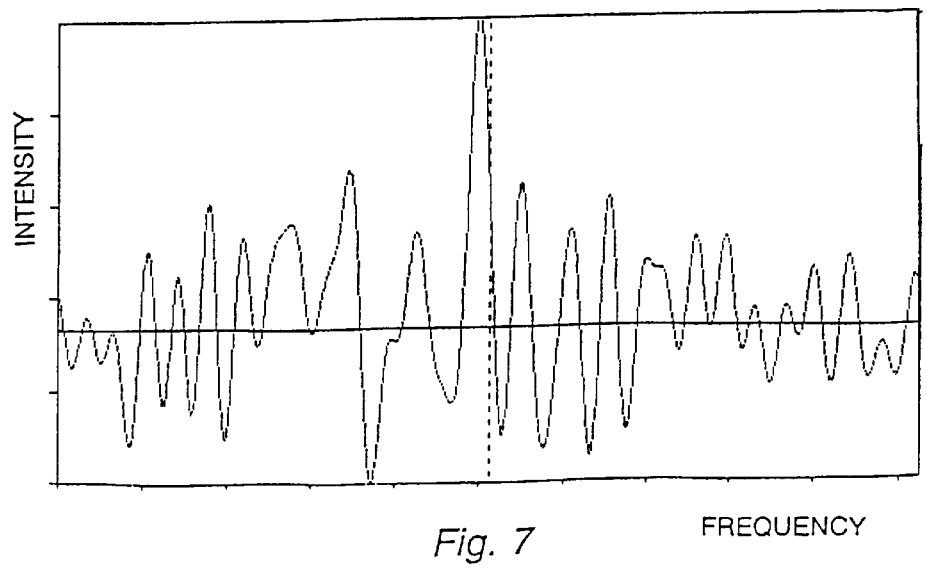
Figure 8:
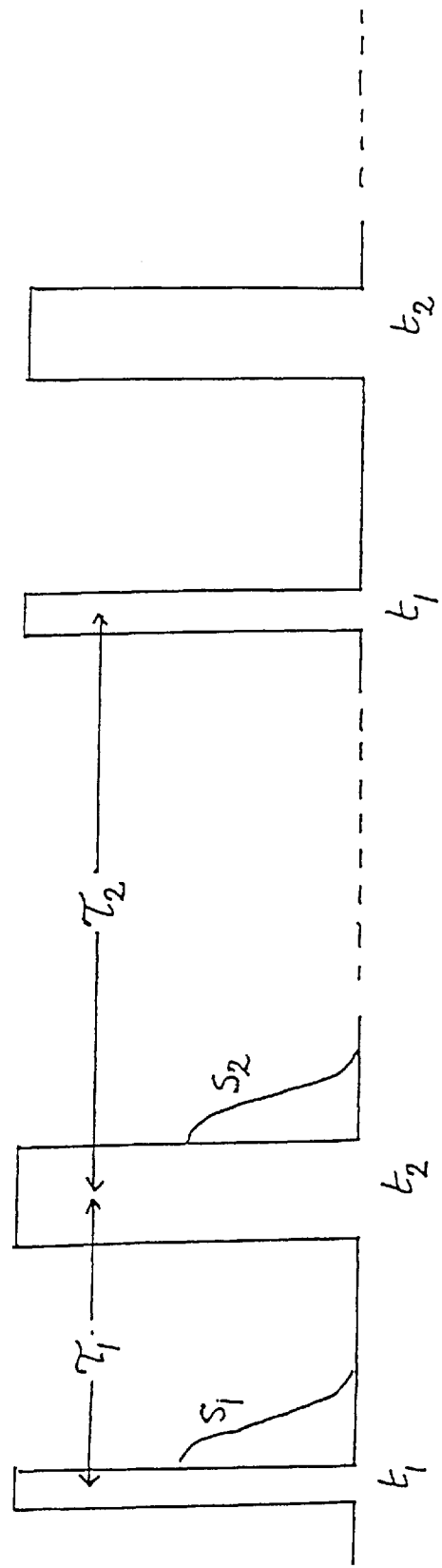
Figure 9:
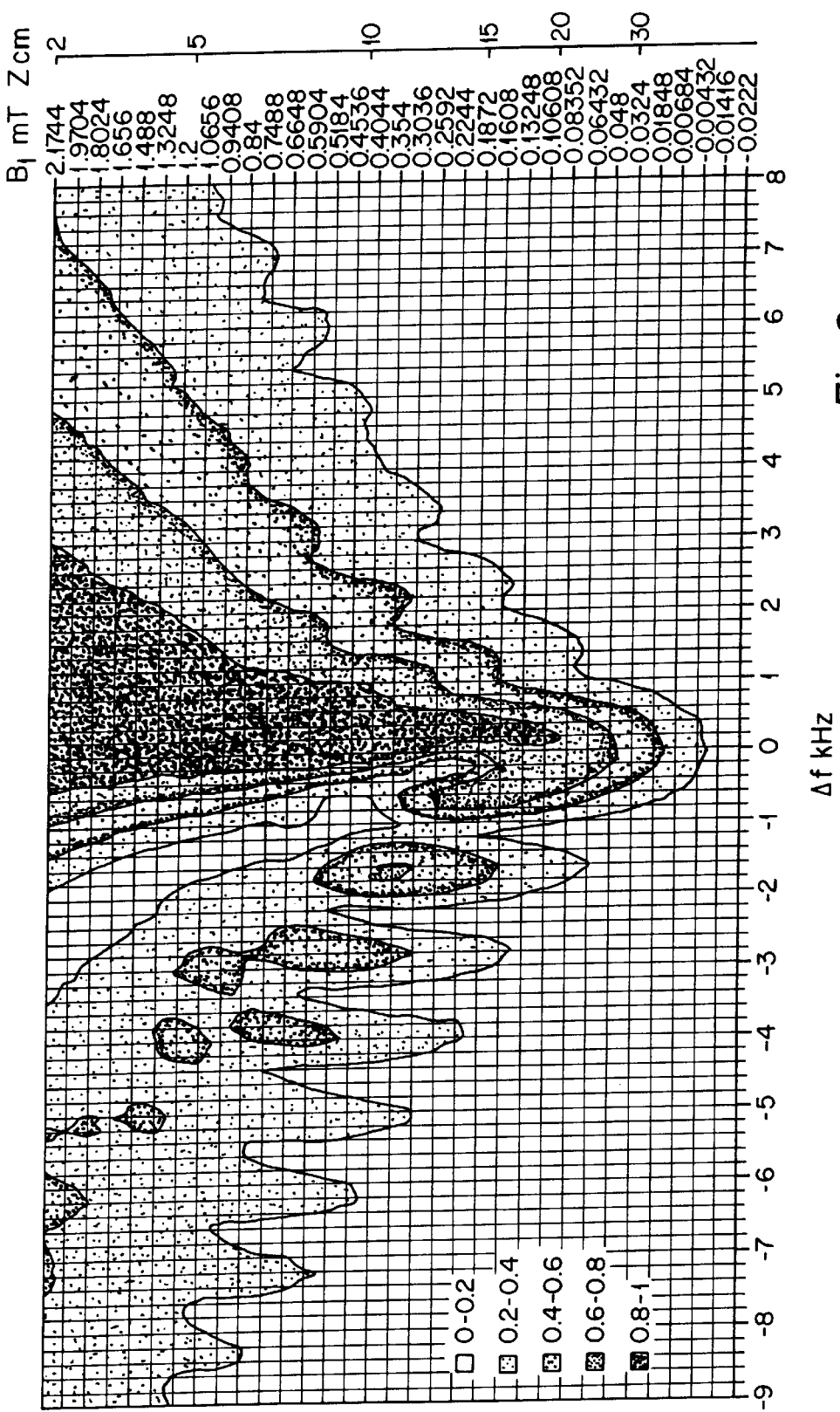
Figure 10:
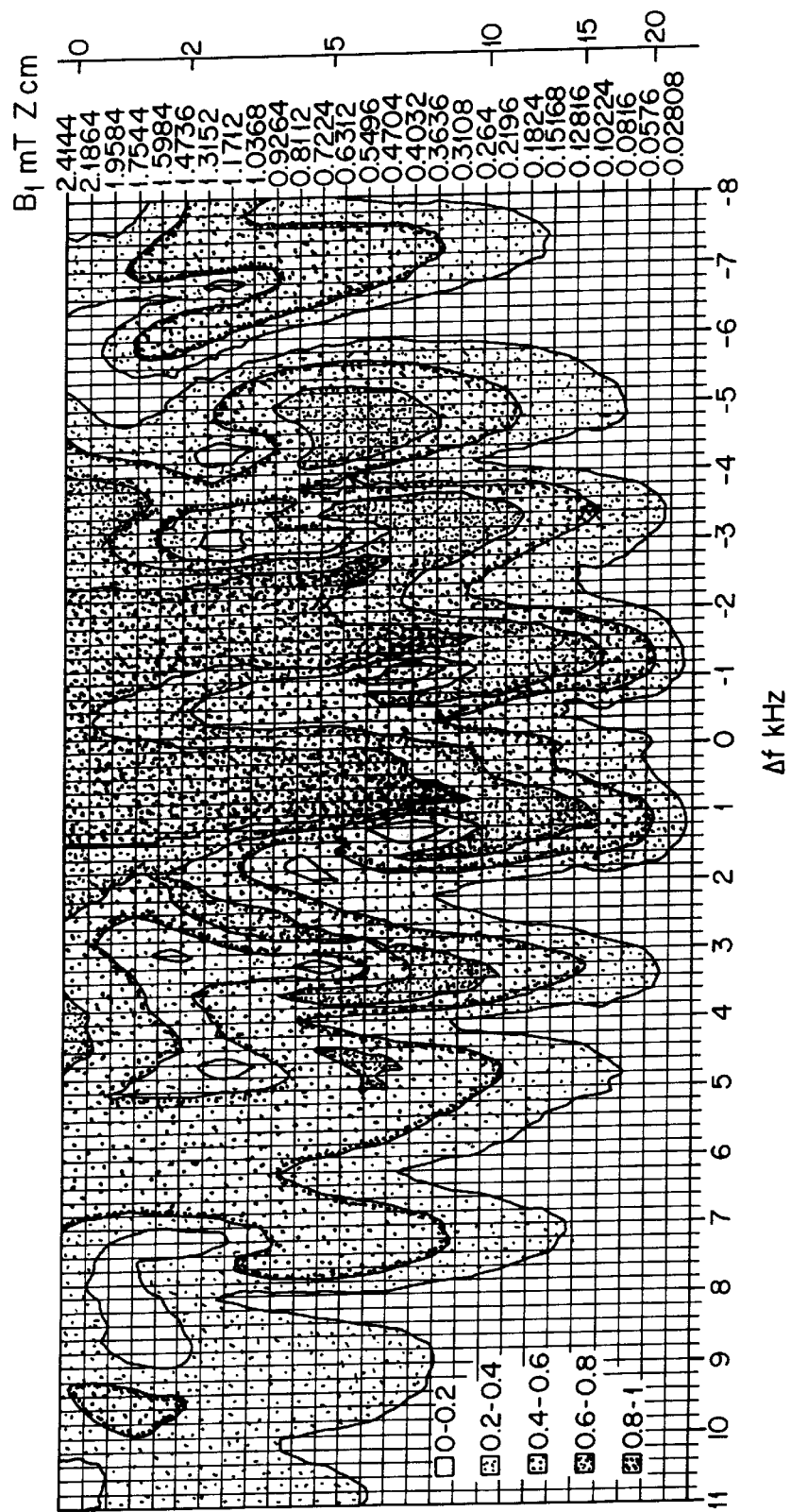
Figure 11:
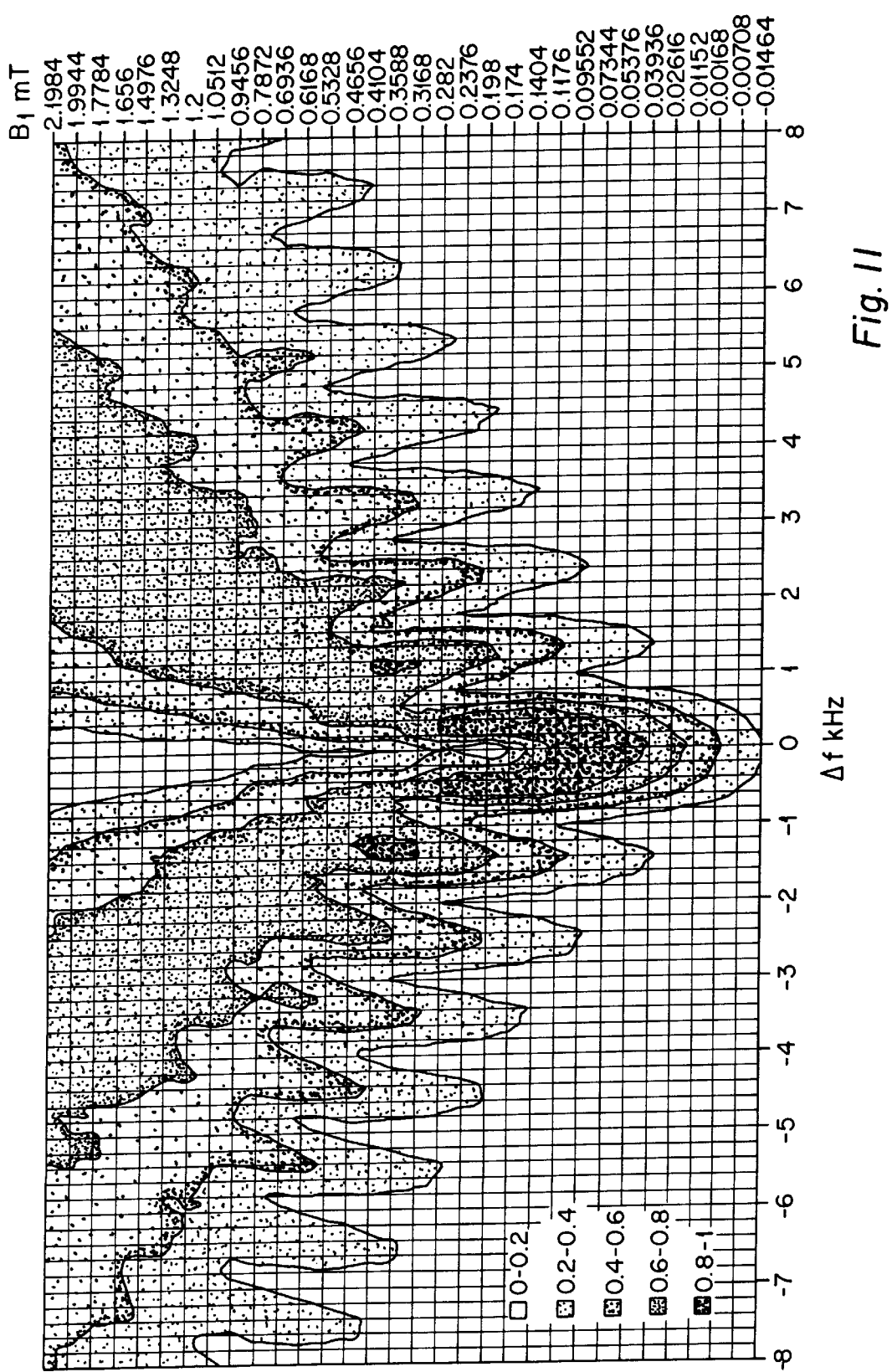

FIGS. 6(a) and 6(b) are spectra for samples of the explosive RDX at two different distances from an r.f. probe of the testing apparatus;

FIG. 7 is a spectrum similar to those of FIG. 6 but for a different distance, Z;

FIG. 8 is a pulse sequence for use with an embodiment of the present invention;

FIG. 9 is a contour plot of signal intensity versus $B_1$ field and frequency offset for an adiabatic half passage pulse sequence;

FIG. 10 is a similar plot for a BIR-4 pulse sequence;

FIG. 11 is a similar plot for a simple rectangular pulse sequence; and

Figure 12:
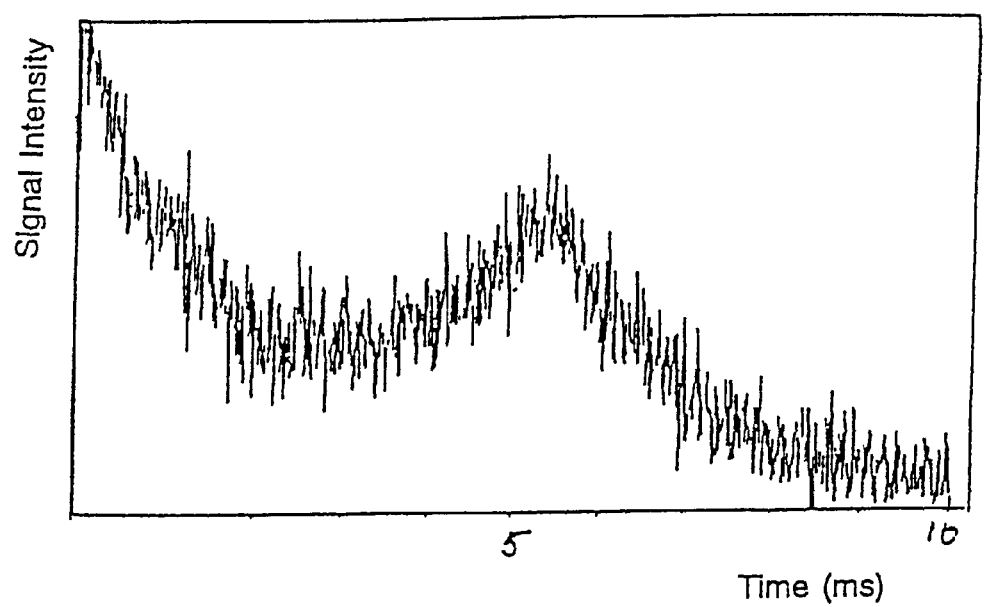

FIG. 12 is a plot of signal intensity versus time for a BIR-4 pulse sequence.

Figure 1:
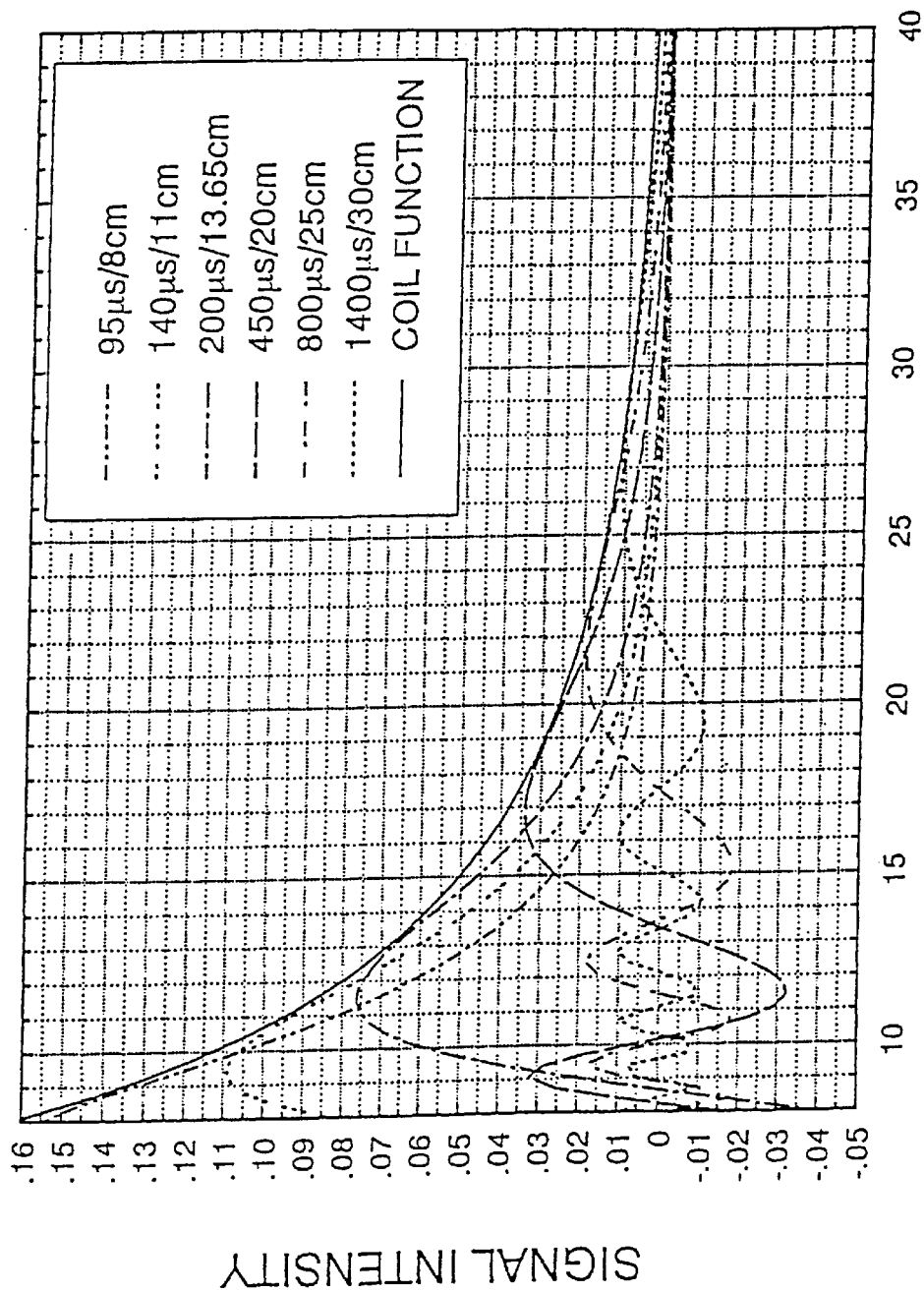
FIG. 1 shows a series of plots of the signal received by a probe as sample distance, Z, is varied.

The theory underlying the invention is first described, with reference to FIG. 1.

Known techniques for detecting the presence of a particular substance in a sample conventionally do so whilst the sample is on a conveyor belt or the like, and do so using a pair of Helmholtz r.f. coils, the sample being placed between, and close to, the coils. In this fashion, it is possible to maintain a relatively uniform r.f. field throughout the sample, and hence maintain relatively uniform sensitivity of detection.

In the detection of remote samples such as buried or concealed objects, on the other hand, the distance from the sample to the probe would usually be significant, greater for instance than some measure of the size of the probe such as its maximum dimension (usually the outer diameter of the r.f. coil). Also, it is generally possible to place a probe or probes on one side of the sample only. In such circumstances, with the use of conventional excitation, the r.f. coil is not generally capable of generating a uniform r.f. field $B_1$ within the total field of view; this can yield a sensitivity of detection which may be highly non-uniform. This is explained in detail in the following analysis.

An excitation pulse at the resonance frequency $\omega_Q$ of the relevant quadrupolar nuclei may be regarded as generating a nominal flip angle $\alpha$ which depends on the r.f. field $B_1$ and the pulse width $t_w$. Unless the context otherwise demands, the term "flip angle" as used herein connotes the actual rather than "effective" value. For example, for spin-1 systems, 119° is the flip angle which gives the maximum signal, thus corresponding to an effective 90° flip.

For spin-1 nuclei $$\alpha = 2\gamma B_1 t_w \qquad (1)$$

The signal $S_x$ generated in the coil by a polycrystalline sample depends on $\alpha$ according to the expression $$S_x \propto \omega_Q \cdot \frac{\sin\alpha - \alpha\cos\alpha}{\alpha^2} \qquad (2)$$

which has a maximum at $\alpha=119°$ (0.66π radians), a zero at 257° (1.43π rad.) and the first negative maximum at 340° (1.90π). Equation 2 has been derived for the fully relaxed case where τ is greater than or equal to 5 $T_1$. τ is the pulse repetition time, the time between successive repeated pulses or pulse sequences. $T_1$ is the spin-lattice relaxation time for the relevant nuclear species.

Reference is now made to FIG. 1. FIG. 1 shows a series of plots of the signal received by a true spiral r.f. coil as sample distance from the plane of the coil, Z, is varied; each individual plot is for a pulse whose width (duration) (termed "$t_p(119°)$") has been chosen to produce the optimum flip angle of 119° at a particular sample distance, Z. The $t_p(119°)$ pulse width is given alongside the sample distance in the inset to the figure. The signal intensity scale has been normalised to 1 at Z=0. Each plot therefore represents the signal received by the coil as the sample is moved from its 119° position.

In FIG. 1 the full line, termed ("coil function") represents, for a true spiral coil, the signal received by the coil from the response of a sample at Z to a $t_p(119°)$ pulse appropriate to the particular value of Z. Since a $t_p(119°)$ pulse has been chosen, the magnetisation induced in the sample will be the same for each Z value. By the reciprocity law for transmission and reception of magnetic fields for a coil, this plot, with suitable scaling, would be identical to a plot of the distribution of $B_1$ field over distance Z. The variation of $B_1$ with Z for a true spiral coil is governed by Equation 4, given below.

Aside from the coil function plot, the remaining plots are theoretical plots, being plots of the relevant Bessel function response curve. However, the particular pulse widths $t_p(119°)$ at given values of Z have been derived experimentally for the particular apparatus employed to test experimentally the theories underlying the present invention. In more detail, the plots of FIG. 1 other than the "coil function" plot have been derived by a simultaneous solution of Equations 1, 2 and 4. Given the variation for a particular pulse of the $B_1$ field with Z from Equation 4, $B_1$ can then be converted into flip angle using Equation 1 to yield the dependency of flip angle with Z; it will be apparent that for a particular pulse the flip angle generated in the sample reduces as Z is increased. The signal intensity generated at the sample for given Z can then be deduced given the variation of flip angle with Z from Equation 2. Finally, the signal received at the (receiver) coil can be obtained from the variation of the signal intensity at the sample with Z by a further application of Equation 4.

Whilst the plots of FIG. 1 are specific to the particular type of spiral coil employed, analogous plots could of course be derived for other coil configurations by use of a different relationship in Equation 4.

It is be noted that the curves presented in FIG. 1 have been derived for the situation where $\tau/T_1$ is greater than or equal to 5. In other words, it is assumed that the response signal is fully relaxed such that there is no saturation of the signal.

Suppose now that it is desired to detect buried samples up to maximum distances of, say, 25 to 30 cm from the plane of the coil. Suppose further that, to produce the maximum signal from a sample at a depth of (say) 30 cm, the $B_1$ field and/or pulse width $t_w$ is adjusted so as to give the optimum flip angle (for example 119°), at this distance. This would be achieved by setting the pulse width at 1400 μs for a root mean square pulse power of 675 W using the particular testing apparatus developed pursuant to the present invention. FIG. 1 then shows the signal received by the r.f. probe as the sample distance Z is varied, using the pulse duration (1400 μs) which is optimised for the 25 to 30 cm depth (see the short-dashed line). There is indeed a maximum in the signal intensity between 25 and 30 cm, but at intermediate distances the signal oscillates in magnitude and sign, and, at some distances, for example 13.5 and 17.5 cm, the signal is actually zero, so that samples centred near these distances would generate very weak or even zero responses. There are in fact no less than seven null points in the region from Z=10 cm to the region of interest such as could give rise to a serious lack of sensitivity.

Moreover, if there were two samples to be detected within the field of view, with one adjacent a positive peak and one adjacent a negative peak, their signals could have nearly or exactly opposite phase at resonance. Hence the signals could nearly or even exactly cancel, thus generating a false negative response from the testing apparatus. In the example described above, if one sample were at a distance of 26 cm and the other at a distance 14 cm, it can be seen from FIG. 1 that signal cancellation could occur. A similar effect could also occur with a single elongate sample.

Furthermore, it the temperatures of the two samples and therefore their resonance frequencies were different, for example due to thermal gradients in the ground or within the sample, partial or complete cancellation could occur at any distance. The problem could not be overcome by improving the received signal intensity at shorter distances, for instance by using a shorter pulse of, say, 140 μs duration at the same power. FIG. 1 shows that this would produce acceptable signals at distances of between 8 to 14 cm, but at (say) 30 cm the received signal would be unacceptably weak.

It will be understood that the strength of a signal relative to noise can be improved according to the number of signal accumulations. Hence by "unacceptably weak" is meant that an adequate signal-to-noise ratio cannot be achieved within a given acquisition time. Such a time is usually defined by physical restraints such as the speed of a conveyor belt transporting the sample past the testing apparatus, or the need to clear a given area of explosives in as short a time as possible (for instance 1 or 2 minutes per square meter).

The present invention seeks to provide, in three preferred aspects, solutions to the above described problems concerned with a non-uniform $B_1$ field and hence non-uniform sensitivity of detection. These aspects are described shortly; next however a preferred embodiment of testing apparatus for putting the invention into effect is described.

Figure 2:
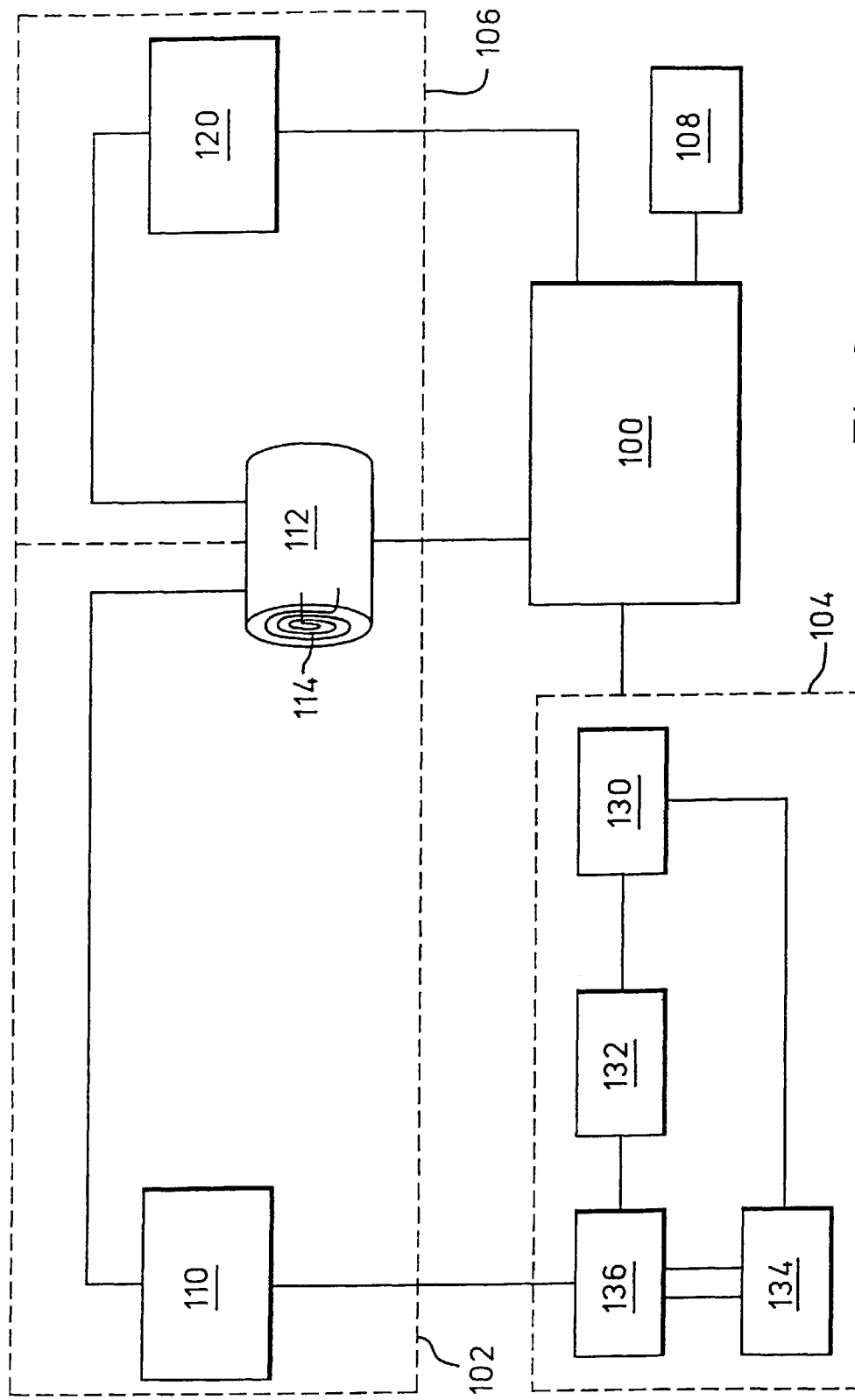
FIG. 2 is a block diagram of a preferred embodiment of testing apparatus according to the present invention.

The preferred embodiment is described with reference to FIG. 2. The embodiment is particularly suited to the detection of objects or samples underground or beneath or behind concealing barriers, where it is important to be able to move the r.f. probe during the measurement of NQR responses. The apparatus is suitable for the application of simple excitation pulses (that is, those which are rectangular in the time domain). It is however particularly suited to the application of shaped adiabatic pulses or pulses which have a substantially rectangular shape in the frequency domain. This is by virtue of its capacity to modulate simultaneously the amplitude and phase/frequency of the pulse.

The apparatus comprises in general terms a control computer 100, means 102 for applying one or more radio-frequency excitation pulses to the sample covering a selected excitation frequency range and for a given duration, means 104 for generating composite or shaped pulses, that is frequency/phase and/or amplitude modulated pulses for passing to the excitation applying means 102, means 106 for detecting the NQR response signal, and means 108 for generating an alarm signal in dependence upon whether the presence of a given substance is detected above a predetermined threshold. This may trigger an audio or visual alarm which alerts the operator to the presence of the sample to the detected.

In more detail, the excitation pulse application means 102 includes a radio-frequency power amplifier 110 whose output is connected to an r.f. excitation and detection probe 112. The probe contains one or more spiral antenna coils 114 whose dimensions depend on the field of view required. In many applications, the probe, together with its attendant preamplifiers and isolating circuitry, may need to be portable. The remainder of the apparatus would not normally be portable, but would be connected to the probe by a length of cable. The probe may have one open unshielded end to apply to the sample under examination, and one closed end, perhaps shielded within a suitable screening enclosure. Sufficient clearance should be left between the coil and the box.

In certain circumstances, a Faraday shield or cage on the open side of the probe may be employed to reduce E-field effects; typically this would be a thin sheet of metal (Al, Cu), with a slit down the centre to reduce eddy current effects. The width of the slit would be optimised according to geometry and frequency of operation. E-field effects occur with piezoelectric samples such as sand.

The probe also forms part of the detection means 106, which includes an r.f. preamplifier, receiver and detection circuitry 120. The frequency/phase and amplitude modulated pulses are generated by the shaped pulses generating means 104 under the control of the control computer 100.

The means 104 for generating shaped pulses, (that is, frequency/phase, and/or amplitude modulated pulses) includes a pulse programmer 130, and a spectrometer 132, manufactured by SMIS, United Kingdom, for generating the r.f. carrier signal at a known carrier reference frequency and fixed amplitude, the signals being gated by the trigger signals from the pulse programmer 130, and a signal function generator 134, manufactured by Farnell, U.K (model SFG 25). The r.f. carrier passes to a pulse shaping unit 136. The function generator 134 is operated by a TTL logic signal from the pulse programmer 130.

Figure 3:
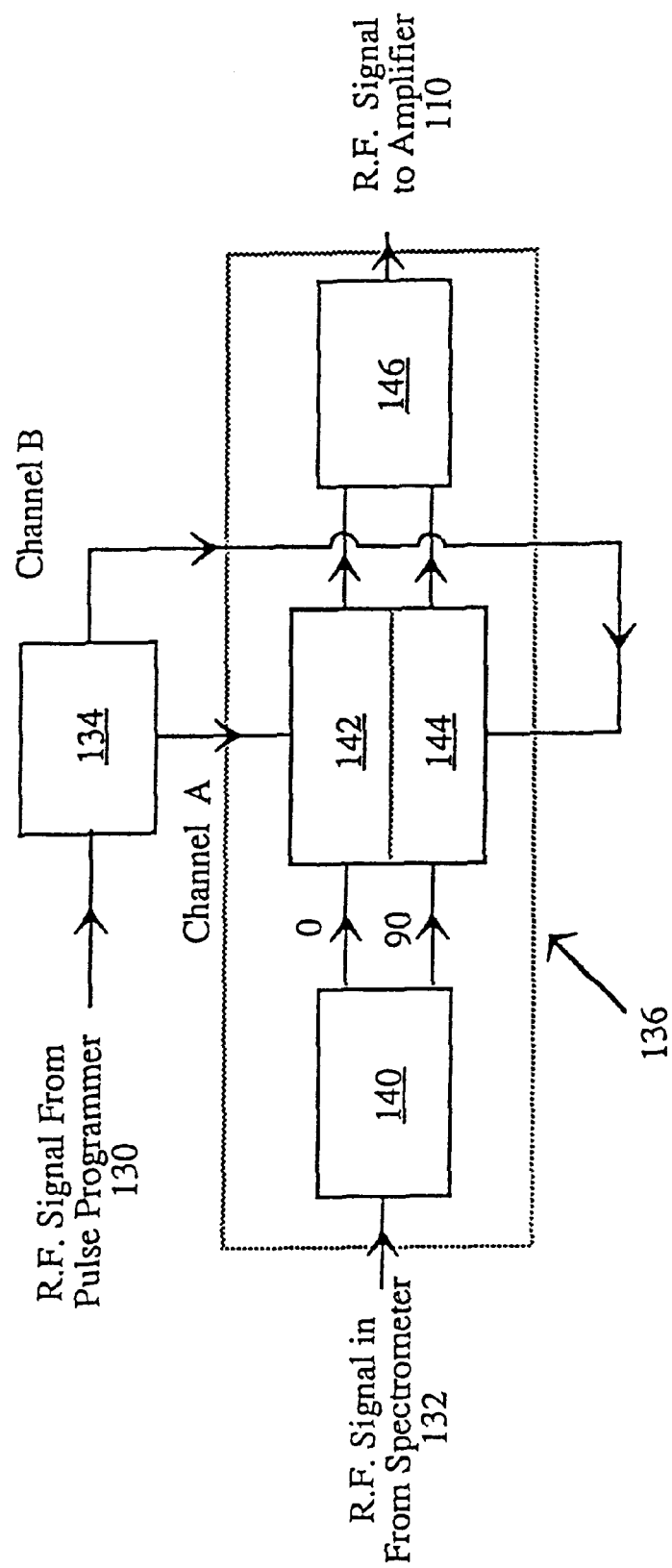
FIG. 3 is a block diagram of a pulse shaping unit forming part of the testing apparatus.

The pulse shaping unit 136 is now described in more detail with reference to FIG. 3. A 0–90 degrees 5 MHz two-way combiner 140, manufactured by Mini Circuits (U.K.) under model no. PSCQ-2-5, itself fed with the r.f. signal from the spectrometer 132, supplies two mixer circuits 142 and 144. Each such mixer circuit is also fed with a modulation signal via a respective Channel A and B from the function generator 134.

The actual mixer circuits employed were constituted as Hatfield (U.K.) double-balanced mixer units (model 1754). However, other suitable circuits are also available such as a Burr-Brown model MPY 634 precision analog multiplier based radio-frequency mixer. The main criterion is that the modulation of the r.f. input by the function generator is linear over the largest possible range of voltage; an additional low power amplifier may be required to achieve this. If a precision analog multiplier is employed, it may be necessary to incorporate capacitors between the power supplies and earth and to incorporate trimming capacitors to remove low frequency voltage offsets from the mixing circuit which might otherwise cause pulse distortion. Two other potential sources of non-linearity must also be eliminated, namely distortion of the pulse due to the limited band width of the r.f. probe and distortion due to non-linearity in the r.f. power amplifier.

The output from the mixer circuits 142 and 144 is passed via a combiner 146 to the amplifier 110. The combiner is a Hatfield (U.K.) component model no. DR102 or 3320.

The present invention is preferably capable of detecting samples at considerable range from the plane of the coil or coils 114 and over a significant range of distance. A typical detection range is from 8 to 35 cm. To achieve this detection range, in the preferred embodiment a planar Archimedean spiral coil is used, with an outside diameter and number of turns determined by the depth which it is intended to probe. Although in the preferred embodiment a planar spiral coil is employed, any form of surface coil would be appropriate. Because of the requirement of remote detection, coils of the solenoid, saddle or Helmholtz form are not generally appropriate.

For samples which are likely to be found at distances not greater than, say, 30 to 50 cm from the coil plane, it has been discovered pursuant to the present invention that an Archimedean spiral of the form $$r = a\frac{\theta}{2\pi} \quad (\theta \text{ in radians}) \tag{3}$$

with a (the distance between conductor centres)=1.5 cm has a satisfactory performance when used with a tubular conductor of diameter 0.8 cm.

A total of 7.75 turns can produce a spiral of outside diameter about 25 cm and overall length 3.4 m. Supposing that the wavelength, $\lambda$, of the r.f. carrier frequency is 5.2 MHz, the overall length is $\lambda/17$. This is close to the rule-of-thumb limit of $\lambda/2$ usually believed necessary to avoid phase effects.

A planar Archimedean spiral generates an on-axis r.f. field $B_1$ ($\perp$) given by the expression $$B_1(\perp) = \frac{I}{b}\left[\ln\left(\sqrt{\theta^2+1} + \sqrt{\theta^2+\frac{Z^2}{b^2}}\right) - \frac{\sqrt{\theta^2+1}}{\sqrt{\theta^2+\frac{Z^2}{b^2}}}\right]_{\theta_1}^{\theta_2} \tag{4}$$

where for the present embodiment $\theta$ varies between $1.5\pi$ ($\theta_1$) to $17\pi$ ($\theta_2$) radians, $b=a/2\pi$, $a=1.5$ cm and I is the r.f. current. The effective field of view at a given distance Z, meaning the dimensions of the circle in a plane parallel to that of the plane of the spiral for which the total $B_1$ field has fallen off by 25% relative to its value at the centre, depends on the distance apart, Z, of the two planes; it is 14 cm for Z=3.2 cm and 20 cm for Z=28.2 cm, which it has been found pursuant to the present invention give acceptable performance for detection of explosives in the range of, say, 8 to 35 cm from the plane of the r.f. probe.

The function of Equation 4 is shown plotted in FIG. 1 as the "coil function" curve.

The present invention has the aim, amongst other aims, of solving the problems encountered in the prior art and discussed previously. These problems are associated with the detection of samples which are located in a non-uniform r.f. field within the total field of view. Solutions to these problems are sought to be provided in three preferred aspects of the invention. These three aspects are now described in order of the increasing r.f. pulse power required to implement them.

For all of the aspects, examples have been provided of the operation of the invention with reference to one particular resonance frequency (5.2 MHz) of the explosive RDX. The invention would, of course, also function satisfactorily at other resonance frequencies and for other NQR substances.

(1) First Aspect

In the first preferred aspect of the present invention, based on minimal r.f. power requirements, usually a pulse sequence involving a single r.f. pulse is employed, repeated in a time of the order of or less than $T_1$, the spin-lattice relaxation time of the nuclear species being excited. Strict control is exercised over the pulse width and power.

Figure 4:
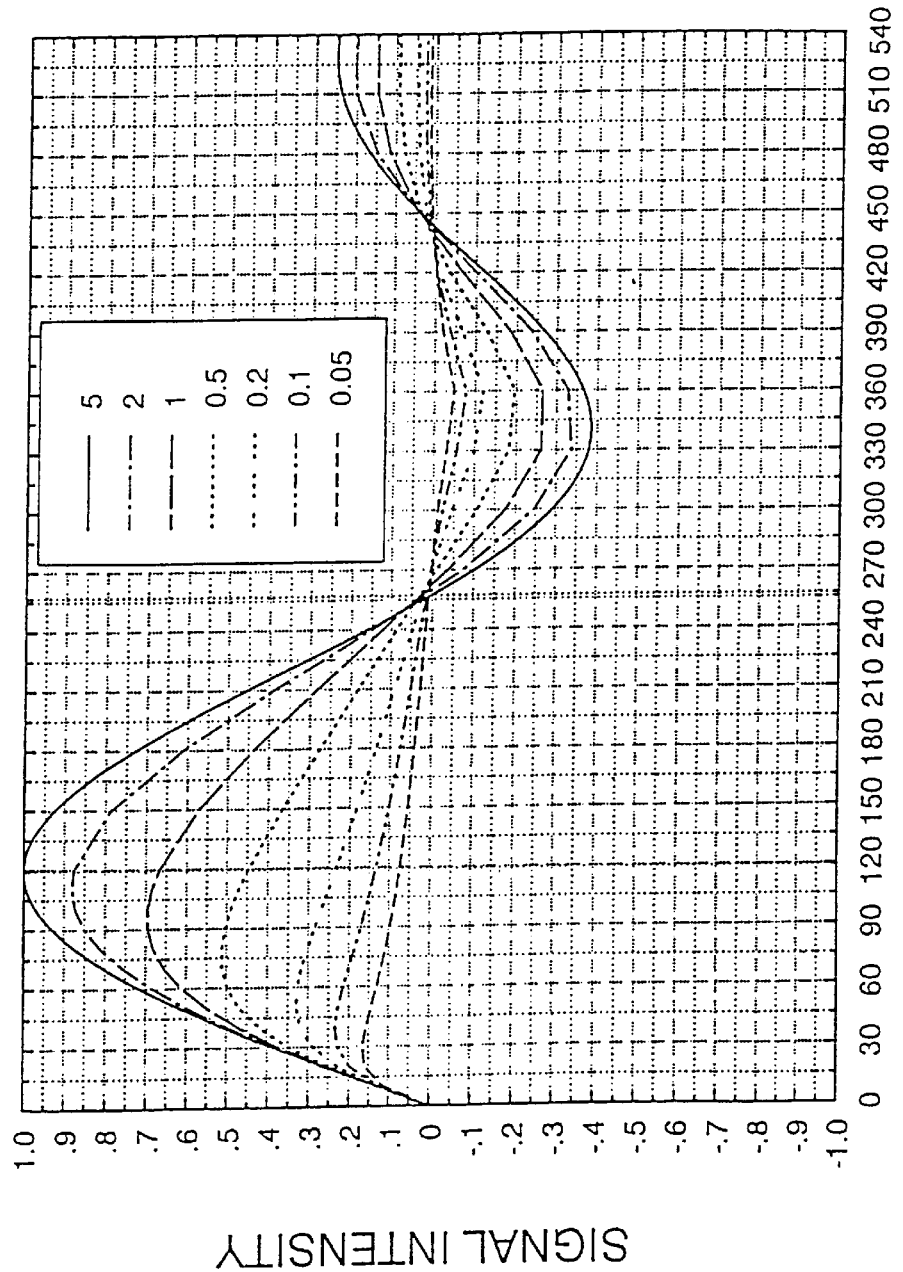
FIG. 4 shows a series of plots of signal intensity versus flip angle for the various $\tau/T_1$ values shown in the inset, $\tau$ being the pulse repetition time, $T_1$ being the spin-lattice relaxation time.

By way of background to this aspect of the invention, it should be explained that, if the pulse repetition time, $\tau$, is of the order of $T_1$ (typically less than 5 $T_1$), then the response will not be completely relaxed. (A sequence of repeated pulses for which $\tau$ is of the order of $T_1$ is herein termed a "$T_1$ limited cycle".) in this case, Equation 2 no longer holds true. In fact, it has been shown by Vega (J. Chem. Phys. 61 1093 (1974)) that peak signal decreases in intensity and moves to lower flip angle as $\tau/T_1$ decreases from a value of 5. The various equations presented by Vega have been solved numerically pursuant to the present invention for the case of quadrupole resonance of an I=1 powdered sample. The results are shown in FIG. 4. This figure shows a series of plots of signal intensity versus flip angle for the $\tau/T_1$ values shown in the inset; signal intensity is normalised to a maximum signal intensity of unity obtained at a flip angle $\alpha$ of 119° for the $\tau/T_1$=5 case (assumed to be fully relaxed). It can be seen that peak signal decreases in intensity and moves to lower flip angle as $\tau/T_1$ decreases from a value of 5. For all the plots, zero signal intensity is reached at $\alpha$=257°. It should be noted that FIG. 4 shows the signal intensity at the sample rather than at the (receiver) coil.

It will be apparent from the true spiral "coil function" plot of FIG. 1 that, all other factors being equal, a signal received at a receiver coil from a more distant sample will be less than that received from a nearer sample. On the other hand, it will be apparent from FIG. 4 when taken in combination with Equations 1 and 4 that over a range of flip angle (extending up to 257°), and hence over a range of distance, the signal generated at the sample for a given pulse can actually increase the more distant the sample is. The present invention in the first preferred aspect seeks to balance these two effects to produce a received signal intensity which is as invariant with distance as possible over a specified range of distance (which range is itself as large as possible). It has been found pursuant to the present invention that these effects can better be balanced the lower the value of the ratio $\tau/T_1$, in other words that for lower values of the ratio $\tau/T_1$ the observed signal shows a reduced variation with sample distance.

In more detail concerning the first aspect of the invention, the (usually) single pulse in the pulse sequence is of such a width and root mean square power as to produce a zero in the signal response (corresponding to $\alpha$=257°) at a distance slightly less than the minimum value at which the sample or samples are to be detected. This ensures that the desired range corresponds to the appropriate range of flip angle as determined from FIG. 4 and that there are no null points or negative going signals proceeding outwardly from the minimum distance.

Further, the value of the ratio $\pi/T_1$ is set relatively low (less than 5, preferably less than 2, 1 or even 0.5), so that the maximum signal response at the sample is achieved at a sufficiently low value of flip angle. At values of flip angle lower than the value corresponding to this maximum, signal intensity decreases rapidly. Hence the useable flip angle range (and thus the desirable range of distance from the plane of the coil) is bounded approximately on the one side by the flip angle corresponding to the maximum signal and on the other side by the zero crossing flip angle value of 257°. As can be seen from FIG. 4 the useable flip angle range is greater at lower values of $\tau/T_1$.

Now suppose, for example, that the pulse width $t_w$ is set to generate a 257° pulse at an on-axis distance of 2.05 cm from the plane of the probe and a 119° pulse at 5.2 cm, and that $\tau/T_1$ is set at 0.5. At distances greater than 2.05 cm, the flip angle diminishes and the free induction decay signal intensity generated in a probe notionally located at the sample would increase. On the other hand, at the actual, distant r.f. probe, all other factors being equal the received signal would decrease according to Equation 2. The net effect, it has been discovered, is a partial or complete cancellation of the two conflicting effects over a limited range, such that over a distance of, say, 2.5 to 13 cm the received signal varies very little.

Figure 5:
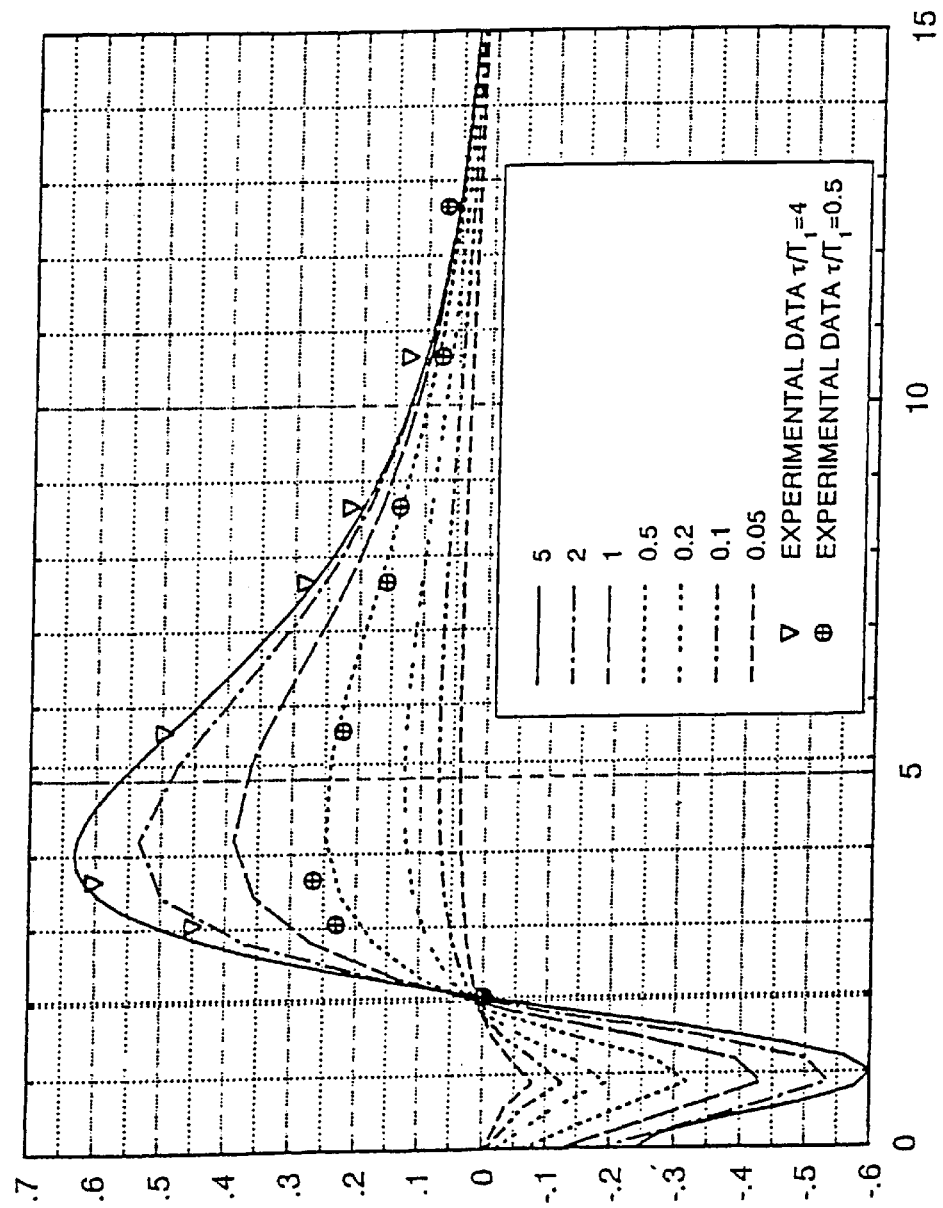
FIG. 5 shows a series of plots of signal intensity versus distance, Z, for the various values of the ratio $\tau/T_1$ shown in the inset.

Reference is now made to FIG. 5 to illustrate this point. FIG. 5 shows the variation of signal intensity (as received by the probe) with distance Z from the plane of the probe along the coil axis for various values of the ratio $\tau/T_1$. As stated above the r.f. pulse is selected to give a 257° flip angle at Z=2.05 cm and a 119° flip angle at Z=5.2 cm. In FIG. 5, the various curves are theoretical predictions, whilst the data points are experimentally derived values, as shown in the inset to the figure.

The theoretical plots were derived from the plots of FIG. 4 in a fashion analogous to that described for the derivation of the plots of FIG. 1, except that Equation 2 was replaced by the Vega equations as discussed above (or their graphical solution as shown in FIG. 4).

The experimental results were derived using a 38 g sample of "PE-4" (based on the explosive RDX) at two different values of the ratio $\tau/T_1$, namely 4 and 0.5, corresponding to the triangular and circular symbols respectively. In FIG. 5, the theoretical plots were scaled to the peak of the fully relaxed experimental data ($\tau/T_1$=4).

It can be seen that the experimental results agree well with the theoretical predictions.

It is noticeable in FIG. 5 that for $\tau/T_1$=5 the maximum signal intensity does not occur at the $\alpha$=119° position of Z, but at a somewhat nearer Z value. This is on account of the attenuation at greater distances of the signal from the sample as received by the probe, in accordance with Equation 4.

It can be deduced from the experimental data in FIG. 5 that, between Z=3 and Z=13 cm, the $\tau/T_1$=4 response varies by a factor of 10, whilst the $\tau/T_1$=0.5 response varies by a factor of only 2.4. More generally, it can be seen from the various theoretical curves that, for lower values of $\tau/T_1$, for example, 0.5 or less, the observed signal obtained by Fourier transformation of the f.i.d. does show a considerably reduced variation with distance above 3 cm than pertains for higher values of the ratio. Hence it is preferable to employ these lower values of the ratio $\tau/T_1$.

However, for certain substances, for example, the explosive RDX, a practical lower limit on the value of the ratio $\tau/T_1$ can be imposed by the free induction decay time, $T_2^*$. For the free induction decay to be detected properly, it is usually thought that the pulse repetition time $\tau$ should not be much less than 5 $T_2^*$. For RDX at room temperature $T_2^*$ is roughly 1.5 ms whilst $T_1$ is roughly 15 ms. Hence the lowest satisfactory value of $\tau$ for RDX at room temperature may be 7.5 ms, corresponding to a value of $\tau/T_1$ of 0.5.

In the example described above, typically a positive signal of substantial signal strength could be obtained over a range of 2.5 to 13 cm. As another example, for a pulse set to produce a flip angle of 119° at 14 cm and an appropriate value for the ratio $\tau/T_1$, a positive detectible signal could be derived over a range of roughly 10 to 20 cm with the received signal intensity varying by a factor of about five.

It is estimated that r.m.s. pulse powers of less than 100 W would be required to achieve a signal-to-noise ratio of 5:1 for a sample of RDX of about 40 gm between 9 and 16 cm from the plane of the probe in a time of less than 10 s. For the same power, longer times would be required to detect a 1 kg sample at a distance of 30 cm. Whilst the reduction in signal intensity as $\tau/T_1$ is reduced can be partly offset by the use of more pulse cycles within a given acquisition time, a $T_1$-limited cycle as described in the first preferred aspect of the present invention may be relatively slow in operation. However, it does require only low r.f. powers. It would be particularly appropriate in circumstances where it was required to detect the presence of remote objects over a relatively small range of distance.

(2) Second Aspect

In a second preferred aspect of the present invention, two or more pulses (or pulse sequences) are used at the same excitation carrier frequency but are of differing powers and/or have differing pulse widths. The powers and/or widths are selected to generate the optimum flip angle of 119° at two or more different distances from the plane of the r.f. probe, a particular power/width corresponding to a particular distance. The f.i.d. responses from each of the pulses are acquired and processed independently, and adjusted to produce the same phase after Fourier transformation. The resulting absorption spectra are then added, or preferably the area under each resulting absorption spectrum is added.

A particularly fast sequence uses just two differing pulse types and is termed herein a two pulse sequence. The principle of the technique of the second preferred aspect of the present invention is described with reference first to FIG. 1 in relation to an exemplary two pulse sequence, although of course the description could equally be applied to sequences with a greater number of differing pulse types.

The pulse sequences could be $T_1$-limited cycles as described in relation to the first preferred aspect of the invention discussed above. However, it may be desirable not to employ fast pulsing sequences; the pulse separation, $\tau$, may in this embodiment preferably be greater than 3 or even 5 times $T_1$, so that a fully relaxed state is reached before each new pulse.

In the exemplary sequence, pulse 1 in the two pulse sequence is selected for the apparatus developed pursuant to the present invention to have a width $t_w$ of between 100 and 140 μs and an r.m.s. power of about 675 W; it can be deduced from FIG. 1 that such a pulse, given sufficient quantities of the substance to be detected, could generate satisfactory signal responses at distances of between, say, 8 and 15 cm from the plane of the r.f. probe (which in the preferred embodiment is the spiral coil to which reference has already been made). Pulse 2 has a width of between 200 and 450 μs at the same r.m.s. power, or alternatively the same width as pulse 1 but with the r.f. power adjusted to increase the $B_1$ field proportionally. It can be deduced from FIG. 1 that pulse 2 would generate satisfactory responses at distances of between 15 and 30 or 35 cm from the plane of the r.f. probe. Hence the two differing pulses in combination (if suitably arranged) can generate satisfactory responses at distances of between, say, 8 and 35 cm from the plane of the r.f. probe, without there being any null points or negative going signals in this range. The exemplary two-pulse sequence is therefore particularly suited to the detection of buried or concealed explosives.

Experimental spectra obtained using the above-described exemplary two-pulse sequence to detect differing quantities of the explosive RDX at different distances from the plane of the r.f. probe are shown in FIGS. 6 and 7. In FIGS. 6(a) and (b) are shown the f.i.d.'s of the $^{14}$N response from the 5.19 MHz line of RDX with a 100 μs pulse of r.m.s. power 675 W. For FIG. 6(a) the RDX was in a quantity of a few grammes at a distance of 9 cm from the plane or the r.f. probe, whilst for FIG. 6(b) the corresponding values were a four tens of grammes at a distance of 13.65 cm. An acceptable signal-to-noise ratio was achieved for both cases. Equally, FIG. 7 shows that an acceptable signal-to-noise ratio was achieved with RDX in a substantially larger quantity at a distance of 30 cm, with a 200 μs pulse of the same r.m.s. power and frequency. 200 μs is the value of $t_p$ (119°) for 13.65 cm.

In fact it has been found pursuant to the present invention that with the two-pulse sequence described above (specifically one in which one pulse has a width of 100 μs and the other a width of 450 μs), good results can be obtained over a range of Z from 8 to 35 cm.

It will of course be understood that other pulse combinations than the exemplary two-pulse sequence described above are possible according to the nature of the particular problem to be solved. The pulse widths can be adjusted to match the requirements of the particular search, that is, the quantities of material to be detected and the distances at which they are likely to be found. It may be necessary to use more than two differing pulses if the samples to be detected are located over a wide range of distance.

One possible combination of pulses employs a pulse which is shaped so as to have a substantially rectangular shape in the frequency domain at least as the longer or longest of the pulses. Such a pulse would have a better bandwidth performance than a simple rectangular pulse, which would be of value at greater distances. For simplicity one or more simple rectangular pulses could be employed for the other pulses.

It is one of the important advantages of the second preferred aspect of the invention that the use of two or more pulse sequences of differing widths does not necessarily increase the acquisition time proportionally. This is achieved by interleaving of the two or more pulse sequences. If the pulse sequences are so interleaved, it is important that they are applied in the correct order, if more than one sample is likely to lie in the field of view.

In a two pulse sequence, for example, because $T_2^*$, the f.i.d. time, is invariably much shorter than $T_1$, the spin-lattice relaxation time, the shorter pulse should precede the longer. This point is illustrated first with reference to FIG. 8, which shows a preferred interleaved pulse sequence for the purposes of this aspect of the invention.

The first pulse is short pulse of width $t_1$, following which the first f.i.d. $S_1$ is captured and digitised. There is then a time interval of about $\tau_1 = 2T_2^*$, during which the nuclei excited by this pulse, which are located predominantly closer to the probe, dephase, $\tau_1$ may suitably be as low as roughly $T_2^*$ to as high as roughly 3 or 5 $T_2^*$. The dephasing may be partial or complete (so that in the latter case no transverse magnetisation exists), dependent upon the distance of the sample from the plane of r.f. probe and hence the flip angle (which may be the maximum 119° or some lesser value). Also, since $T_2^* \ll T_1$, the longitudinal magnetisation will not have recovered to any significant extent.

The second, longer pulse, of width $t_2$ (or the r.f. power may be varied, and the width kept constant) is now applied and its f.i.d. $S_2$ captured and digitised. The signal from this pulse would come predominantly from a sample or samples further away from the plane of the r.f. probe.

The two-pulse sequence is repeated after an interval after the second pulse $\tau_2$ which is of the order of $T_1$ to $2\,T_1$ (say, between 0.5 and $3\,T_1$) at the temperature of the sample or samples. The pulse repetition rate, $\tau$, is thus $\tau_1+\tau_2$. After N such repetitions, the summed signals $S_1$ and $S_2$ are separately acquired, processed and examined by the computer, the separately Fourier transformed data finally being added if appropriate. Separate processing is important to avoid the cancellation of one positive signal by a negative signal.

If two or more samples are present at different depths, as mentioned above it is important that the former shorter pulse is applied before the latter longer pulse. In this way there need be no risk that the (say) two samples interface with each other so that only a negligible response signal is produced. This is now explained further with reference to a 140/450 µs combination of pulses (see FIG. 1).

The case is first considered in which the nearer sample is in the region where the latter, longer 450 µs pulse would produce a negative signal at the probe (between Z=10 and 13 cm), whilst the farther sample is a significantly greater depth. The former, shorter 140 µs pulse would generate nearly a 119° flip angle at the nearer sample, so that no significant longitudinal magnetisation would remain to be excited by the latter pulse. Hence the nearer sample would generate no response to the latter pulse, and there would thus be no interference between the nearer and farther sample, the farther sample being detected by the latter pulse.

The case is next considered where the nearer sample is in the positive response region of the latter, longer pulse (Z>13 cm, beyond the zero crossing point of the latter pulse), but is either within the excitation range of the shorter pulse (say, Z<20 cm) or nearer than the maximum for the longer pulse (say, Z<18 cm). The farther sample is again at a significantly greater depth. If the nearer sample were within the excitation range of the former, shorter pulse at all, the former pulse would generate less than a 119° flip, and some longitudinal magnetisation would therefore remain to be excited by the latter pulse. However, since signals received by the probe from the two samples would both be positive, the resultant effect would be additive. Again, there is therefore no interference, either partial or complete, between the responses generated by the two pulses if two or more samples are present.

Considering now finally the case where the nearer sample is either outside the excitation range of the shorter pulse (say, Z>20 cm) or farther than the maximum for the longer pulse (say, Z>18 cm), it is clear that the response from the latter, longer pulse would predominate in respect of both samples, so that there would again be satisfactory detection of both samples.

Suppose, on the other hand, contrary to the preferred manner of putting the invention into practice, that the two pulses were applied in the reverse order, with the longer coming first, and again that there were two or more samples within the field of view.

In the first place, as already described in relation to FIG. 1, the response signal from the nearer sample could partially or completely cancel that from the farther. The signal $S_2$ (in respect of the longer but now former pulse) could therefore be weak or even undetectable, despite the presence of material to be detected in both the near and the far region.

Furthermore, by the time of arrival of the second, shorter pulse, after an interval of about $2\,T_2^*$, nuclei in the near region already perturbed by the first pulse could have dephased, so that $S_1$ (in respect of the shorter but now latter pulse) could also be weak or even undetectable, despite the presence of material to be detected in the near region. Hence where two (or more) samples are present at different depths, a situation might arise in which no signal can be detected at either depth with either pulse.

In short, then, applying the two pulses in reverse order leads to problems because of the possibility that the longer pulse may give rise, at intermediate depths, to signals which are negative and which hence may cancel signals from the shorter pulse.

It will be apparent from the foregoing discussion that it is important not only that the shorter and longer pulses are applied in the correct order, but also that they are adjusted to create the maximum 119° flip angle at the correct relative distances. Specifically, it is preferable that the 119° flip angle position of the shorter pulse falls within the first range of distance, approaching from infinity, for which the longer pulse generates an opposite signed signal intensity. If the 119° position of the shorter pulse were either further away from or nearer to the plane of the probe, this pulse would be incapable of making the necessary compensation for the negative going range of the longer pulse.

If more than two different pulse types (say, three or four) were used, each pulse being optimised for a different depth, then the sensitivity of detection might be more uniform over depth. On the other hand, the cancellation effects referred to previously might be more significant, and it may be particularly important to ensure that the shortest pulse is applied first in the sequence, and the longest last, but with pulses optimised for adjacent distances being separated from each other. If, say, at least four pulses were used, then it might be advantageous to apply the pulses in the order first, third, second, fourth (first denoting the shortest) provided that the first and third, and second and fourth, pulses were not prone to mutual cancellation.

As an example of the application of an interleaved two pulse sequence, the explosive RDX at 295K is considered, whose $^{14}$N signal at 5.19 MHz has $T_2^*=1.4$ ms and $T_1=12$ ms. Without interleaving of the two pulses $t_1$ and $t_2$, each sequence would occupy 1.5 s for 100 accumulations, setting the pulse repetition time to 15 ms. Hence the total duration of both pulse sequences would be 3 s (neglecting the pulse widths). On the other hand, with interleaving of the pulses, the total time with $\tau_1=3$ ms and $\tau_2=15$ ms is 1.8 s.

It is a further feature of a two (or more) pulse sequence as previously described that it can be employed to provide an estimate of the distance of a sample from the plane of the r.f. probe and/or of the approximate quantity of the material of interest. This is a consequence of the fact that at constant pulse r.f. power, and hence constant r.f. current to the probe, both the $B_1$ field and the r.f. signal induced in the probe depend only on the distance of the sample from the plane of the probe. This conclusion is strictly true only for on-axis locations, but the modifications needed to allow for samples off-axis are not large and are well-known from publications such as that of C. B. Bosch and J. J. H. Ackerman, "NMR Basic Principles and Progress", Vol. 27, Springer-Verlag, 1992, pp. 3–44 (see in particular FIGS. 3a to 3d on pages 8 and 9).

With this feature of the present invention, it is important that the signal is captured after each pulse and processed in an identical fashion. For instance, the same receiver, the same computer, the same phase gain, and so on, should be used, failing which the accuracy of the distance or quantity estimation could be prejudiced.

In putting this feature into practice, two different sequences are used, both sequences being fully relaxed (that is, with $\tau \geq 3$ or $5\,T_1$). One such sequence contains pulses of width $t_1$ and the other pulses of width $t_2$; each pulse has the same r.m.s. power. Each sequence on its own provides strong signals from different spatially localised regions. For example, as is apparent from FIG. 1, a pulse of width 140 μs produces strong signals from samples at distances of between 8 and 14 cm, whilst the corresponding distance range for a pulse of width 450 μs is between 14 and 35 cm. Distance to the sample is determined by comparing the accumulated signal after (say) 100 pulses of width $t_1$, which is termed $S_1$, with that after the same number of pulses of width $t_2$, say $S_2$. The ratio $S_1/S_2$ is a sensitive function of distance over a considerable range. Referring to FIG. 1, it can be seen that $S_1=S_2$ at a distance (z) of 1.5 cm from the plane of the r.f. probe. At other distances, its value can be both positive or negative, taking into account the phases of the accumulated signals. The following table provides values of the ratio $S_1/S_2$ for various values of Z.

| Z(cm)     | 9   | 12   | 15  | 18   | 21   |
|-----------|-----|------|-----|------|------|
| $S_1/S_2$ | 3.6 | −2.7 | 1.4 | 0.55 | 0.38 |

The particular pair of pulse types described above provides reasonable spatial localization over distances from 8 to about 20 cm from the plane of the r.f. probe; other combinations will have different range of distance.

Once the depth of the sample is known, the stronger signal can be used to provide an estimate of quantity. This can, for example, be derived from the theoretical plots in FIG. 1 and a prior calibration of the signal to be expected from the testing apparatus from a known quantity of the material to be detected at a known distance from the r.f. probe. It will be understood that the accuracy of the quantity estimate will be affected by the size and shape of the sample, the uncertainty being greater the larger the extension of the sample along the $B_1$ gradient.

If there is more than one sample in the field of view, a minimum of two different pairs of pulse sequences are needed to provide an estimate of their distances and quantities. A computer programme or the like, which is based on the graphical data in FIG. 1, determines from two different values of the signal ratios $(S_1/S_2)_1$ and $(S_1/S_2)_2$ from each pair of sequences which combination of quantities and distances best fits the experimental ratios. However, where there are two (or more) samples there will be a correspondingly greater uncertainty and poorer resolution than in the case of a single sample.

If it is required to perform the spatial localization in the minimum time, the pair of pulse sequences may be interleaved, under the same conditions as have previously been discussed in relation to the second preferred aspect of the present invention. However, it is now necessary to allow for the effect of the different flip angles induced by pulse 1 on the signal generated by pulse 2. For example, if pulse 1 has a width of 140 μs, FIG. 1 shows that at distances greater than (say) 13 cm, there will still be a finite longitudinal magnetisation present in any sample located in this region, which will affect the response following pulse 2, as has already been discussed. If the spin-lattice relaxation time $T_1$ of the quadrupolar nuclei is known, this effect can be allowed for by means of the usual relaxation equations, and the ratio $S_1/S_2$ can still provide an estimate of distance, but with a greater uncertainty than when the two pulse sequences are conducted separately under fully-relaxed conditions.

(3) Third Aspect

As discussed above, for typical "one-sided" coils, the $B_1$ field decreases sharply as distance away from the coil increases. With the types of excitation described so far, this decrease in $B_1$ causes a corresponding sharp decrease in the flip-angle α, as defined by Equation (1) above.

In a third preferred aspect of the present invention, so-called "adiabatic fast passage" pulses are employed which are shaped so as to provide (in a given region) a substantially constant flip angle over a wide range of $B_1$. As a consequence, all nuclei within the field of view of the r.f. probe (defined here as the region over which the adiabatic criterion is satisfied) are perturbed to the same extent, and the signals received by the r.f. probe depend only on their distance from the probe. The term "adiabatic fast passage" connotes a pulse for which the rate of change of the magnetic field is sufficiently fast to avoid $T_1$ effects, but sufficiently slow to enable the crystallite magnetisation to follow the effective field, although this definition is not intended to limit the scope of the present invention.

As discussed earlier, adiabatic pulses are known in the field of Nuclear Magnetic Resonance imaging, but would not have been expected to work in the field of Nuclear Quadrupole Resonance, particularly Nuclear Quadrupole Resonance testing of polycrystalline samples. Indeed, it is not fully understood why they do.

Notwithstanding that adiabatic pulses have been found pursuant to the present invention to function successfully in NQR, the adiabatic pulses which have been tested exhibit poorer off-resonant performance than in NMR. However, as mentioned later, it may be possible to make significant improvements to the performance of the basic adiabatic pulses presented herein by theoretical optimisation considering the spin transformations occurring in polycrystalline samples, so that the deficit in performance may not be particularly significant.

In the context of the present invention, an important feature of adiabatic pulses is that they can be tailored to produce the optimum flip angle of 119° over a range of depths, and can hence provide a general method of obtaining optimum sensitivity with a complete absence of interference between signals from samples at different depths, since there is no variation of flip angle with depth.

Two possible disadvantages of adiabatic pulses in the present context are firstly that to use them to best effect requires higher r.f. powers than for comparable rectangular pulses, and secondly that they have a reduced bandwidth performance, and are therefore more sensitive to effects such as temperature which may shift the NQR frequency.

In order to define the adiabatic conditions, reference is made to a rotating coordinate frame at a frequency $\omega_Q$, in which the starting frequency at the beginning of the adiabatic pulse is off-set by $\Delta\omega_{max}$; the effective frequency in the rotating frame is then $$\omega_{\text{eff}} = [\Delta\omega_{\max}^2 + (\gamma B_1)^2]^{1/2} \tag{5}$$

corresponding to an effective field $B_{1\text{eff}}$ $$B_{1\text{eff}} = \left[\left(\frac{\Delta\omega_{\max}}{\gamma}\right)^2 + B_1^2\right]^{1/2} \tag{6}$$

The excitation carrier frequency is then swept from the starting frequency (at the frequency offset $\Delta\omega_{max}$) rapidly to resonance, as $B_1$ is simultaneously varied. $B_1$ is maintained very much greater than $B_{loc}$, the local field in the solid. For the whole process to be adiabatic, the magnetisation must always follow $B_{1eff}$ and the rate must be fast compared to $T_1$ and $T_2^*$. At resonance, $\Delta\omega=0$ and, for NMR, the magnetisation would be left pointing along $B_1$ and would be rotated through 90° (effective) irrespective of the initial value of $B_1$. The effect is the same as that of a 90° (effective) pulse, but the flip angle is independent of the $B_1$ r.f. field. Such a process is termed Adiabatic Half Passage. If the frequency sweep is continued to a frequency offset of $-\Delta\omega_{max}$ the magnetisation is inverted and the equivalent of a 180° (effective) pulse is obtained. This latter process is termed Adiabatic Full Passage. It will be understood that whilst the flip angle is independent of $B_1$, received signal strength will vary with distance.

With Adiabatic Half Passage (AHP), two major requirements must be fulfilled. Firstly, as for all adiabatic pulses, the adiabatic condition $|(d\alpha/dt)|<<1|\gamma B_{1eff}|$ must be met throughout the duration of the pulse. Secondly, $B_{1eff}$ must rotate through $\pi/2$ radians (or through $\pi$ radians for adiabatic full passage). Within these constraints adiabatic passage may be performed using any suitable pair of amplitude and phase/frequency modulation functions.

The ability of the particular modulation functions chosen to satisfy the adiabatic condition governs the magnitude of the $B_1$ range and the absolute $B_1$ range over which the pulse will perform satisfactorily. Hence, all adiabatic pulse have upper and lower peak r.f. power limits between which they will operate adequately at a given frequency sweep and pulse duration.

It has been discovered pursuant to the present invention that the adiabatic conditions can be achieved for the majority of crystallites in a polycrystalline sample by the use of hyperbolic tan and inverse tan modulation functions for amplitude and phase-modulated half-passage:

$$\omega_1(t) = \omega_{1max}\tanh\left[\frac{\zeta t}{t_p}\right] \quad (7)$$

$$\phi(t) = -\frac{\Delta\omega_{max}t_p}{\kappa\tan\kappa}\left[\ln(\cos\kappa) + \ln\left(\frac{\cos[\kappa(1-t/t_p)]}{\cos\kappa}\right)\right] \quad (8)$$

where $\omega_{1max}$ and $\Delta\omega_{max}$ are modulation amplitudes, $\omega_1(t)$ is the r.f. amplitude at time t, $\phi(t)$ is the phase at time t (in radians), $t_p$ is the pulse duration, and $\zeta$, $\kappa$ are constants, set in the preferred embodiment to 10 and 1.52 radians respectively. $\Delta\omega_{max}$ was set to $2.83\times10^5$ radians.

Although the tanh and 1/tan modulation functions have been described above, it may be advantageous in certain circumstances to derive tailored optimised modulation functions to operate over the required $B_1$ range. A numerical optimisation procedure could be employed to reduce the unknown variables.

The BIR-4 pulse sequence is now described. BIR-4 is preferred to AHP (or AFP), because, unlike AHP, it is capable of performing plane or spherical rotations of the magnetisation. $\pi$ or $\pi/2$ radian plane rotation pulses would usually be considered necessary if it is desired to generate echoes. BIR-4 has also been found to provide good compensation for $B_1$ inhomogeneity and resonance offset, marginally outperforming adiabatic half passage at comparable powers.

As already stated, BIR-4 is a type of adiabatic plane rotation pulse. Such pulses may in general be regarded as being composed of a number of segments each of which can be adiabatic half-passage, adiabatic half passage time reversed, or adiabatic full passage. With the BIR-4 type of pulse sequence employed in the preferred embodiment, these may be regarded as consisting of four segments, each consisting of a half-passage or time-reversed half passage. It has been found that adiabatic conditions can be achieved using the following hyperbolic tan and inverse tan modulation functions for the four segments:

Segment 1 ($0<t<0.25\ t_p$):

$$\omega_1(t) = \omega_{1max}\tanh\left[\frac{\zeta(1-4t)}{t_p}\right] \quad (9)$$

$$\phi(t) = \frac{-\Delta\omega_{max}t_p}{4\kappa\tan\kappa}\left[\ln(\cos\kappa) + \ln\left(\frac{\cos[4\kappa t/t_p]}{\cos\kappa}\right)\right] \quad (10)$$

Segment 2 ($0.25\ t_p<t<0.5\ t_p$):

$$\omega_1(t)=\omega_1(0.5\ t_p-t) \quad (11)$$

$$\phi(t)=\phi(0.5t_p-t)+\Delta\phi_1 \quad (12)$$

Segment 3 ($0.5\ t_p<t<0.75\ t_p$):

$$\omega_1(t)=\omega_1(t-0.5\ t_p) \quad (13)$$

$$\phi(t)=\phi(t-0.5\ t_p)+\Delta\phi_1 \quad (14)$$

and Segment 4 ($0.75\ t_p<t<t_p$):

$$\omega_1(t)=\omega_1(t_p-t) \quad (15)$$

$$\phi(t)=\phi(t_p-t)+\Delta\phi_1+\Delta\phi_2 \quad (16)$$

where $\Delta\phi_1$ and $\Delta\phi_2$ are discontinuous phase jumps set by the required final flip angle, $\alpha$, of the BIR-4 pulse:

$$\Delta\phi_1=+\alpha/2 \quad (17)$$

$$\Delta\phi_2=-(\pi+\alpha2) \quad (18)$$

The efficacy of both AHP and BIR-4 pulses has been proven experimentally pursuant to the present invention. The experimental conditions were as follows. An RDX sample was contained within a solenoidal coil of Q-factor 70 and volume 130 ml; pulses of 1 ms width were used, since this was assumed to be the maximum appropriate pulse width for the detection of the 5.19 MHz line of RDX (at around 25° C.) where the free induction decay constant $T_2^*$ is approximately 1.4 ms. In the particular experiments, $B_1$ was varied by changing the power delivered to the coil.

For AHP, FIG. 9 shows a contour map of the relative (normalised) signal intensity received at the r.f. probe following an AHP pulse as a function of $B_1$ (vertical scale, peak value). The intensity scale is shown at the top of the figure, and the horizontal scale is the frequency off-set $\Delta f$ in kHz of the excitation frequency from the resonance frequency of 5.19 MHz. Also shown is the distance Z(cm) from the plane of the r.f. probe along the coil axis corresponding to the $B_1$ scale for the r.f. power used. $\Delta\omega_{max}$ was 45,000 rad s$^{-1}$, equivalent to 7 kHz for a 1 ms pulse, $\zeta=10$ and $\kappa 1.52$ radians.

In the experiment, AHP was found to function well over a $B_1$ range of 0.09 to at least 2.2 mT, a minimum range of 2.1 mT, corresponding to sample distances of 20 to 2 cm from the spiral r.f. probe coil. Bandwidths was narrow at lower $B_1$ values, but increased considerably at higher $B_1$. At least 80% of the maximum obtainable signal was obtained over a range of 0.30 to 2.17 mT over a bandwidth of 0.6 kHz or more.

Further experiments conducted with a value of $\Delta\omega_{max}$=283,000 rad s$^{-1}$ (equivalent to a frequency sweep of 45 kHz for a 1 ms pulse) exhibited a somewhat broader bandwidth at low values of $B_1$, but this was at the expense of somewhat worse performance at higher $B_1$.

The value of $\Delta\omega_{max}$=45,000 rad s$^{-1}$ (as used in the derivation of FIG. 9) may be best suited for the detection of explosives since the high signal region extends over a broad range of $B_1$ field and has a large bandwidth of over 3 kHz at high fields, corresponding to a temperature variation of ±3° C. in RDX. This value of $\Delta\omega_{max}$ implies a frequency sweep of approximately 7 kHz, and could thus allow a relatively high probe Q with resulting lower detector power requirements and higher sensitivity.

In further experiments, the effect of changing the constants $\zeta$ and $\kappa$ was investigated. It was found that within limits these constants do not influence the performance of the pulse.

For BIR-4, FIG. 10 shows the comparable performance of a BIR-4 pulse with $\Delta\omega_{max}$=283,000 rad s$^{-1}$, equivalent to 44 kHz for a 1 ms pulse, and $\Delta\phi_1=\Delta\phi_2$=225°, corresponding to a flip angle of $\alpha=90°_{effective}$. $\zeta$=10 and $\kappa$=1.52 rads.

BIR-4 was found to function well over a $B_1$ range of 0.20 to at least 2.4 mT, corresponding to distances of 0 to 10 cm at a frequency offset of around 0.5 kHz. The bandwidth of the 80% signal region at this offset is approximately 1 kHz. However, there is an additional high signal region, at an offset of around −2 kHz. This region could be used to increase signal acquisition rate, but is of restricted bandwidth below a $B_1$ field of about 0.7 mT.

Further experiments established that the value of $\Delta\omega_{max}$=283,000 rad s$^{-1}$ was optimal.

In yet further experiments, the effect of changing the constants $\zeta$, $\kappa$, $\Delta\phi_1$ and $\Delta\phi_2$ was investigated. It was found that within limits the performance of the pulse is insensitive to the value of $\zeta$, but somewhat sensitive to the value of $\kappa$. $\kappa$=1.52 was found to be an optimal value. Sensitivity was also exhibited to the constants $\Delta\phi_1$ and $\Delta\phi_2$, but $\Delta\phi_1=\Delta\phi_2$=225° was found to be optimum.

The sensitivity to constants $\Delta\phi_1$ and $\Delta\phi_2$ possibly suggests the BIR-4 acts as a variable flip angle pulse in NQR. This sensitivity might possibly be exploited by stepping the values of $\Delta\phi_1$ and $\Delta\phi_2$ during the pulse or between pulses.

For the sake of comparison, FIG. 11 shows the comparable performance of a simple rectangular pulse of 1 ms duration. The expected side-band behaviour is exhibited. For the main signal, the pulse gives 80% or more of maximum magnetisation signal at peak $B_1$ fields between 0.054 mT and 0.12 mT, a range of 0.064 mT, with a bandwidth of roughly 0.6 kHz.

By comparison with the simple rectangular pulse, AHP improves the insensitivity to the peak $B_1$ field for the detection of RDX by more than 20-fold, with improved excitation bandwidth. The AHP pulse is insensitive over a roughly 20-fold variation in the $B_1$ field. These benefits are obtained at the expense of an increase in minimum $B_1$ field for spin excitation by a factor of at least 2, and hence an increase in the r.f. power by a factor of at least 4.

The performance of the BIR-4 pulse is similar to that of the AHP pulse, although BIR-4 is thought to be marginally better in that it has a better response to frequency off-set than AHP at comparable power levels.

Another important feature of the third, adiabatic pulses, aspect of the invention concerns the use of echoes. Signal to noise ratio for a given acquisition time is improved by the use of a BIR-4 sequence containing two or more suitable pulses arranged to generate echo response signals.

In various experiments with RDX, two 1 ms BIR-4 for adiabatic half range (with an effective flip angle of 90°) pulses, specified by $\Delta\omega_{max}$=283,000 rad s$^{-1}$, $\zeta$=10, $\kappa$=1.52, and $\phi_1=-\phi_2$=225° for Adiabatic Half Passage (with an effective flip angle of 90°) and $\phi_1=-\phi_2$=270° for Adiabatic Full Passage (with an effective flip angle of 180°), corresponding to a $\pi/2-\tau-\pi$–echo sequence, with a peak $B_1$ field of 0.9 mT and a value of $\tau$ of 6.5 ms, gave the echo signal shown in FIG. 12 after 50 accumulations.

Echoes were also generated using a Pulsed Spin Locking echo sequence of the form $(\pi/2-\tau-)_n$–echo, with $\phi_1=\phi_2$=225°. In similar experiments carried out using half passage pulses, no echo response signals were generated.

It has therefore been demonstrated for the first time in the field of Nuclear Quadrupole Resonance that BIR-4 pulses can be used to generate trains of echoes. However, it would appear on the basis of the experiments conducted so far that a plane rotation adiabatic pulse is necessary if echoes are to be generated, and that therefore AHP and AFP could not generate echoes.

The utility of the technique of the third preferred aspect of the present invention may be less than that of the other two aspects due to the relatively high power requirements and limited detection bandwidth of the AHP and BIR-4 pulses. These factors may offset the advantage in speed of inspection derived from the $B_1$ insensitivity of adiabatic pulses. Whether an adiabatic pulse could favourably be used would depend on the temperature variation, and consequent resonant frequency variation, of the sample over time in any particular detection scenario and on whether the local temperature in the search area can readily be determined with sufficient accuracy of other methods. This would often need to be determined by field trial.

In the technique of any of the preferred aspects of the present invention, any uncertainty in the temperature of the sample can be allowed for as taught, for example, in International Patent Application No. PCT/GB92/00580 (British Technology Group Limited). In the case of the first and second preferred aspects, it is particularly preferred to use excitation pulses which are shaped to have a quadratic phase or frequency variation and a near-rectangular amplitude variation in the frequency domain. Such pulses can have comparatively low power consumption whilst having comparatively high bandwidth. They have been discussed in detail in International Patent Application No. PCT/GB94/02070 (British Technology Group Ltd.), whose disclosure is incorporated herein by reference, and which claims priority from United Kingdom Patent Application No. 9319875.2. These shaped pulses would not however generally be used in conjunction with the adiabatic pulses of the third preferred aspect of the present invention.

If the substance to be detected is buried underground, its temperature is likely to vary in a relatively predictable fashion according to its depth underground. The invention may in those circumstances employ one or more temperature sensors in conjunction with a look-up table to predict the resonant frequency of the substance.

In the case of the second preferred aspect of the invention, if temperature does vary with the distance of the sample from the probe in a predictable manner, compensation for any temperature differences may be made by optimising the first kind of excitation to a first resonance frequency and value of $T_1$ relevant to a first temperature (and hence sample distance), and by optimising the second kind of excitation to a second resonance frequency and value of $T_1$ relevant to a second such temperature, corresponding, say to a greater sample distance. A similar technique could be used with the third preferred aspect of the invention, by replacing the rectangular or shaped pulses with two different kinds of adiabatic pulses tailored to different temperatures (and depths).

Furthermore, in the case of the detection of buried objects, any temperature uncertainties are likely to become less substantial as depth increases, since temperature conditions underground tend to be more stable at greater depth. As against this, due to the requirements of the testing apparatus, excitation bandwidth is likely to be more restricted at greater depths, and hence such temperature induced frequency shifts as may exist may become more difficult to cope with.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. Apparatus for Nuclear Quadrupole Resonance testing a remote sample containing a given species of quadrupolar nucleus, comprising:
   at least one probe having a given maximum cross-sectional dimension;
   means for applying excitation to the probe or at least one of the probes to excite nuclear quadrupole resonance for a selection range of distance of the sample from the or one such probe, the selected range being at least one tenth of the given maximum dimension of the probe or said one such probe, the apparatus being adapted to produce a non-uniform field over the selected range; and
   means for detecting the resonance response signal from the sample via the probe or at least one of the probes;
   the excitation being such as would generate non-zero resonance response signals at all distances within the selected range.

2. Apparatus according to claim 1, wherein the excitation is such that, for a given sample, over the selected range of sample distance the minimum resonance response signal detected would be no less than one twentieth, preferably no less than $\frac{1}{10}$, $\frac{1}{5}$, $\frac{1}{4}$, $\frac{1}{3}$ or $\frac{1}{2}$, of the maximum resonance response signal.

3. Apparatus according to claim 1, wherein the excitation is such as to generate a flip angle which is substantially constant over the selected range.

4. Apparatus according to claim 1, wherein the excitation is such as to generate a flip angle of at least $90°_{effective}$ at at least one location, preferably at at least two separate locations, in the selected range.

5. Apparatus according to claim 1, wherein the probe or at least one of the probes is in the form of a spiral coil.

6. Apparatus according to claim 1, wherein the excitation is such as to generate a flip angle of greater than $90°_{effective}$ but less than $180°_{effective}$ at that extreme of the selected sample distance range nearer the or said one such probe.

7. Apparatus according to claim 1, wherein the excitation applying means is such as to apply, preferably at the same excitation frequency, at least a first and second kind of excitation, the first kind of excitation being arranged to generate a flip angle which differs at each and every location within the selected range from that generated by the second kind of excitation at that particular location.

8. Apparatus according to claim 7, for determining a measure of the distance of the sample from the or said one such probe, including means for comparing the resonance signals generated in response to the respective kinds of excitation and determining from the comparison a measure of the distance of the sample from the or said one such probe.

9. Apparatus according to claim 1, wherein the excitation applying means is adapted to apply the excitation adiabatically, and is adapted to generate a substantially constant flip angle over the selected range.

10. Apparatus for determining a measure of the distance of a sample from a probe, the sample containing a given species of quadrupolar nucleus, comprising:
    at least one probe;
    means for applying excitation to the probe or at least one of the probes to excite nuclear quadrupole resonance for a selected range of distance of the sample from the or one such probe, the excitation applying means being such as to apply at least a first and second kind of excitation, the first kind of excitation being arranged to generate a flip angle which differs at each and every location within the selected range from that generated by the second kind of excitation at that particular location;
    means for detecting the resonance response signals from the sample via the probe or at least one of the probes; and
    means for comparing the resonance signals generated in response to the respective kinds of excitation and determining from the comparison a measure of the distance of the sample from the or said one such probe.

11. Apparatus according to claim 10, wherein the comparing and determining means is adapted additionally to determine from the comparison a measure of the quantity of the given species of quadrupolar nucleus.

12. Apparatus according to claim 10, wherein the excitation applying means is adapted to apply at least two different pairs of first and second kinds of excitation.

13. Apparatus according to claim 10, wherein the excitation applying means is adapted to apply the excitation adiabatically, and is adapted to generate a substantially constant flip angle over the selected range.

14. Apparatus for Nuclear Quadrupole Resonance testing a sample containing a given species of quadrupolar nucleus, comprising:
    means for applying excitation to the sample adiabatically to excite nuclear quadrupole resonance; and
    means for detecting the resonance response signal from the sample;
    the excitation being such as to generate a substantially constant flip angle over a given region.

15. Apparatus according to claim 14, wherein the excitation is arranged to produce a substantially constant flip angle for a variation of the field of at least a factor of one to five, preferably one to ten, twenty or thirty.

16. Apparatus according to claim 14, wherein the excitation is in the form of an adiabatic fast passage.

17. Apparatus according to claim 14, wherein the amplitude or frequency or phase of the excitation is arranged to be modulated according to hyperbolic tan or inverse tan functions.

18. Apparatus according to claim 14, wherein the excitation includes an adiabatic plane rotation pulse.

19. Apparatus according to claim 14, wherein the excitation is arranged to generate echo response signals.

20. A method of Nuclear Quadrupole Resonance testing a remote sample containing a given species of quadrupolar nucleus, comprising:
    providing at least one probe having a given maximum cross-sectional dimension;

applying excitation to the probe or at least one of the probes to excite nuclear quadrupole resonance for a selected range of distance of the sample from the or one such probe, the selected range being at least one tenth of the given maximum dimension of the probe or said one such probe, a non-uniform field being produced over the selected range; and detecting the resonance response signal from the sample via the probe or at least one of the probes;

the excitation being such as would generate non-zero resonance response signals at all distances within the selected range.

21. A method according to claim 20, wherein the excitation is such that, for a given sample, over the selected range of sample distance the minimum resonance response signal detected would be no less than one twentieth, preferably no less than $1/10$, $1/5$, $1/4$, $1/3$ or $1/2$, of the maximum resonance response signal.

22. A method according to claim 20, wherein the excitation is such as to generate a flip angle which is substantially constant over the selected range.

23. A method according to claim 20, wherein the excitation is pulsed excitation repeated at a pulse repetition time $\tau$, the sample has a spin-lattice relaxation time $T_1$, and the value of $\tau/T_1$ is less than 5, preferably less than 2, 1, 0.5, 0.1 or even 0.05.

24. A method according to claim 20, wherein the excitation is such as to generate a flip angle of at least $90°_{effective}$ at at least one location, preferably at at least two separate locations, in the selected range.

25. A method according to claim 20, wherein the excitation is such as to generate a flip angle of greater than $90°_{effective}$ but less than $180°_{effective}$ at that extreme of the selected sample distance range nearer the or said one such probe.

26. A method according to claim 20, wherein, preferably at the same excitation frequency, at least a first and second kind of excitation are applied, the first kind of excitation being arranged to generate a flip angle which differs at each and every location within the selected range from that generated by the second kind of excitation at that particular location.

27. A method according to claim 20, wherein at least two different pairs of first and second kinds of excitation are applied.

28. A method according to claim 20, wherein the excitation is applied adiabatically, and generates a substantially constant flip angle over the selected range.

29. A method of detecting the presence of a remote sample containing a given species of quadrupolar nucleus, comprising:

providing at least one probe;

applying excitation to the probe or at least one of the probes to excite nuclear quadrupole resonance for a selected range of distance of the sample from the or one such probe; and detecting the resonance response signal from the sample via the probe or at least one of the probes;

the excitation being such as to generate a flip angle of greater than $90°_{effective}$ but less than $180°_{effective}$ at that extreme of the selected sample distance range nearer the or said one such probe.

30. A method according to claim 29, wherein the excitation is such that that extreme of the selected sample distance range nearer the or said one such probe is nearer the location for which flip angle is $180°_{effective}$ than that for which flip angle is $90°_{effective}$.

31. A method according to claim 29, wherein the excitation is such that that extreme of the selected sample distance range farther from the or said one such probe is farther than the location for which, between a flip angle of 0 and $180°_{effective}$, the excitation would generate the most intense resonance response signal in the sample.

32. A method according to claim 29, wherein the excitation is such that that flip angle at that extreme of the selected distance range farther from the or said one such probe is less than $90°_{effective}$, preferably less than 75, 60 or even $30°_{effective}$.

33. A method according to claim 29 wherein, preferably at the same excitation frequency, at least a first and second kind of excitation are applied, the first kind of excitation being arranged to generate a flip angle which differs at each and every location within the selected range from that generated by the second kind of excitation at that particular location.

34. A method according to claim 29, wherein the excitation is applied adiabatically, and generates a substantially constant flip angle over the selected range.

35. A method of Nuclear Quadrupole Resonance testing a remote sample containing a given species of quadrupolar nucleus, comprising:

providing at least one probe;

applying excitation to the probe or at least one of the probes to excite nuclear quadrupole resonance for a selected range of distance of the sample from the or one such probe; and detecting the resonance response signal from the sample via the probe or at least one of the probes;

at least a first and second kind of excitation being applied, the first kind of excitation being arranged to generate a flip angle which differs at each and every location within the selected range from that generated by the second kind of excitation at that particular location.

36. A method according to claim 35, wherein for the first kind of excitation the sign of the resonance response signal would change over the selected range of sample distance whereas for the second kind the response signal would have no zero crossings over the selected range.

37. A method according to claim 36, wherein the excitation is applied adiabatically, and generates a substantially constant flip angle over the selected range.

38. A method according to claim 36, wherein the excitation is applied adiabatically, and generates a substantially constant flip angle over the selected.

39. A method according to claim 35, wherein the location within the selected range for which the second kind of excitation generates a $90°_{effective}$ flip angle is a location at which the second kind of excitation would generate a resonance response signal of opposing sign to the sign of the response signal which would be generated by the first kind of excitation at that location.

40. A method according to claim 35, wherein the plurality of kinds of excitation are interleaved with one another to form a repeating cycle of excitation, each of the kinds of excitation being applied during each such repeating cycle.

41. A method according to claim 40, wherein in each such repeating cycle the excitation generating the lower or lowest flip angle precedes the excitation generating the higher or highest flip angle.

42. A method according to claim 35, wherein the resonance signals generated in response to the respective kinds of excitation are acquired and processed separately.

43. A method according to claim 35, of determining a measure of the distance of the sample from the or said one such probe, wherein the resonance signals generated in response to the respective kinds of excitation are compared and a measure of the distance of the sample from the or said one such probe is determined from the comparison.

44. A method of determining a measure of the distance of a sample from a probe, the sample containing a given species of quadrupolar nucleus, comprising:

providing at least one probe;

applying excitation to the probe or at least one of the probes to excite nuclear quadrupole resonance for a selected range of distance of the sample from the or one such probe, at least a first and second kind of excitation being applied, the first kind of excitation generating a flip angle which differs at each and every location within the selected range from that generated by the second kind of excitation at that particular location;

detecting the resonance response signals from the sample via the probe or at least one of the probes; and comparing the resonance signals generated in response to the respective kinds of excitation and determining from the comparison a measure of the distance of the sample from the or said one such probe.

45. A method according to claim 44, wherein additionally determined from the comparison is a measure of the quantity of the given species of quadrupolar nucleus.

46. A method of Nuclear Quadrupole Resonance testing a sample containing a given species of quadrupolar nucleus, comprising:

applying excitation to the sample adiabatically to excite nuclear quadrupole resonance; and detecting the resonance response signal from the sample;

the excitation generating a substantially constant flip angle over a given region.

47. A method according to claim 46, wherein the excitation produces a substantially constant flip angle for a variation of the field of at least a factor of one to five, preferably one to ten, twenty or thirty.

48. A method according to claim 46, wherein the excitation is in the form of an adiabatic fast passage.

49. A method according to claim 46, wherein the amplitude or frequency or phase of the excitation is modulated according to hyperbolic tan or inverse tan functions.

50. A method according to claim 46, wherein the excitation includes an adiabatic plane rotation pulse.

51. A method according to claim 46, wherein the excitation generates echo response signals.

52. Apparatus for Nuclear Quadrupole Resonance testing a remote sample containing a given species of quadrupolar nucleus, comprising:

at least one probe;

means for applying excitation to the probe or at least one of the probes to excite nuclear quadrupole resonance for a selected range of distance of the sample from the or one such probe; and means for detecting the resonance response signal from the sample via the probe or at least one of the probes;

the excitation being such as would generate non-zero resonance response signals at all distances within the selected range.

53. Apparatus according to claim 52, further comprising means for selecting a range of distance in which it is expected that the sample is located to yield said selected range of distance.

54. Apparatus for Nuclear Quadrupole Resonance testing a remote sample containing a given species of quadrupolar nucleus, comprising:

at least one probe; and a control computer programmed to control the probe or at least one of the probes to apply excitation to excite nuclear quadrupole resonance for a selected range of distance of the sample from the or one such probe, and to detect the resonance response signal from the sample via the probe at least one of the probes;

the excitation being such as would generate non-zero resonance response signals at all distances within the selected range.

55. A method of Nuclear Quadrupole Resonance testing a remote sample containing a given species of quadrupolar nucleus, comprising:

providing at least one probe;

applying excitation to the probe or at least one of the probes to excite nuclear quadrupole resonance for a selected range of distance of the sample from the or one such probe; and detecting the resonance response signal from the sample via the probe or at least one of the probes;

the excitation being such as would generate non-zero resonance response signals at all distances within the selected range.

56. A method according to claim 55 further comprising selecting a range of distance in which it is expected that the sample is located to yield said selected range of distance.

* * * * *